US012495710B2

(12) United States Patent
Yi et al.

(10) Patent No.: US 12,495,710 B2
(45) Date of Patent: Dec. 9, 2025

(54) DISPLAY DEVICE

(71) Applicant: Samsung Display Co., LTD., Yongin-si (KR)

(72) Inventors: Chang Ho Yi, Yongin-si (KR); Hyun Min Cho, Yongin-si (KR); Jung Woo Ha, Yongin-si (KR); Tetsuhiro Tanaka, Yongin-si (KR); Seok Je Seong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 490 days.

(21) Appl. No.: 18/118,865

(22) Filed: Mar. 8, 2023

(65) Prior Publication Data

US 2023/0397477 A1  Dec. 7, 2023

(30) Foreign Application Priority Data

Jun. 7, 2022  (KR) .......................... 10-2022-0068659

(51) Int. Cl.
*H10K 59/80* (2023.01)
*H10D 30/67* (2025.01)
*H10K 59/121* (2023.01)

(52) U.S. Cl.
CPC ..... *H10K 59/8792* (2023.02); *H10D 30/6723* (2025.01); *H10D 30/673* (2025.01); *H10D 30/6755* (2025.01); *H10K 59/1213* (2023.02); *H10K 59/1216* (2023.02)

(58) Field of Classification Search
CPC ........... H10K 59/8792; H10K 59/1213; H10K 59/1216; H10K 59/126; H10K 59/123; H10D 30/6723; H10D 30/673; H10D 30/6755; H10D 86/481; H10D 86/423; H10D 86/441; H10D 86/60
See application file for complete search history.

(56) References Cited

U.S. PATENT DOCUMENTS

| 6,734,935 | B2* | 5/2004 | Kim | .................. | G02F 1/133553 |
| | | | | | 349/114 |
| 2011/0108839 | A1* | 5/2011 | Kim | .................. | H10D 86/0231 |
| | | | | | 257/E21.414 |
| 2017/0317104 | A1* | 11/2017 | Jeong | ................. | H10D 30/6723 |
| 2021/0265449 | A1* | 8/2021 | Son | ...................... | H10K 59/124 |
| 2023/0043910 | A1* | 2/2023 | Kurokawa | ............. | H10K 39/32 |

FOREIGN PATENT DOCUMENTS

| JP | 2019-020462 | 2/2019 |
| KR | 10-2005-0051076 | 6/2005 |

\* cited by examiner

*Primary Examiner* — Douglas W Owens
(74) *Attorney, Agent, or Firm* — Innovation Counsel LLP

(57) ABSTRACT

A display device includes a semiconductor layer on an opposite side to a light-blocking layer, the semiconductor layer including an active layer overlapping the light-blocking layer, a first gate insulator on an opposite side to a buffer film with the active layer therebetween, and a first gate electrode on an opposite side to the active layer with the first gate insulator therebetween, a side surface of the first gate insulator includes a first inclined portion contacting a first surface of the semiconductor layer, and a second inclined portion contacting the first inclined portion and the first gate electrode, and a first angle between the first surface of the semiconductor layer and the first inclined portion is less than a second angle between the first surface of the semiconductor layer and the second inclined portion.

20 Claims, 19 Drawing Sheets

DTL: VIE, ANDE
SEM: D1, ACT1, S1
TFTL: BF, SEM, 1000, G1-1, 2000, G1-2, DTL, 150, 160

SEM: D2, ACT2, S2
TFTL: BF, SEM, 1000, G2, 2000, 150, 160

SEM: D3, ACT3, S3
TFTL: BF, SEM, 1000, G3, 2000, 150, 160

DISPLAY DEVICE

CROSS-REFERENCE TO RELATED APPLICATION(S)

This application claims priority to and benefits of Korean Patent Application No. 10-2022-0068659 under 35 U.S.C. § 119 filed on Jun. 7, 2022 in the Korean Intellectual Property Office, the entire contents of which are incorporated herein by reference.

BACKGROUND

1. Technical Field

The disclosure relates to a display device.

2. Description of the Related Art

As the field of display that graphically represents electrical signal information has been rapidly growing, various display devices having excellent characteristics have been introduced which are thinner, lighter and consume less power. Among such display devices, an organic light-emitting display device has advantages in that it has a wide viewing angle, good contrast ratio and fast response speed, and accordingly is promising for the next generation display device.

Such a display device may include thin-film transistors (TFT), capacitors, etc. as a driving circuit. A thin-film transistor may include an active layer including a channel region, a source region and a drain region, and a gate electrode electrically insulated from the active layer by a gate insulator. The active layer of a thin-film transistor may be formed of amorphous silicon or poly-silicon.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device with a simple structure that can prevent the problem that a short-circuit is formed between a gate electrode and a semiconductor layer due to sputtering of ions of the semiconductor layer on a side surface of a gate insulator during the process of etching the gate insulator between the gate electrode and the semiconductor layer.

Aspects of the disclosure also provide a display device with a simple structure that can reduce a step height by a gate insulator and a gate electrode.

It should be noted that objects of the disclosure are not limited to the above-mentioned objects, and other objects will be apparent to those skilled in the art from the following descriptions.

According to an aspect of the disclosure, a display device may include a light-blocking layer disposed on a substrate; a semiconductor layer disposed on an opposite side to the light-blocking layer with a buffer film covering the light-blocking layer disposed between the semiconductor layer and the light-blocking layer; the semiconductor layer comprising an active layer overlapping the light-blocking layer in plan view; and first electrodes and second electrodes disposed on both sides of the active layer, respectively; a first gate insulator disposed on an opposite side to the buffer film with the active layer disposed between the first gate insulator and the buffer film; and a first gate electrode disposed on an opposite side to the active layer with the first gate insulator disposed between the first gate electrode and the active layer, wherein a side surface of the first gate insulator comprises a first inclined portion contacting a first surface of the semiconductor layer; and a second inclined portion contacting the first inclined portion and the first gate electrode, and a first angle between the first surface of the semiconductor layer and the first inclined portion is less than a second angle between the first surface of the semiconductor layer and the second inclined portion.

The first angle may be greater than about 0° and less than about 45°

The shortest distance from a contact surface between the first inclined portion and the second inclined portion to the semiconductor layer may be equal to or greater than about 600 Å.

The first gate electrode may include a first surface facing the first gate insulator; a second surface opposite to the first surface; and a side surface connecting the first surface with the second surface, and a third angle between the first surface and the side surface of the first gate electrode is equal to or less than about 55°.

The third angle may be greater than the first angle.

The display device may further include a second gate insulator covering the first inclined portion, the second inclined portion, the second surface and the side surface of the first gate electrode.

The display device may further include a second gate electrode disposed on an opposite side to the first gate electrode with the second gate insulator disposed between the second gate electrode and the first gate electrode.

A value obtained by dividing a shortest distance from the side surface of the first gate electrode to the second gate electrode by the shortest distance from the second surface of the first gate electrode to the second gate electrode may be equal to or greater than about 0.8.

The semiconductor layer may include a first material, and the second inclined portion of the first gate insulator is at least partially covered by the first material.

The display device may further include a second gate insulator covering the first gate electrode, the first inclined portion, and the second inclined portion, wherein the first material is disposed between the second inclined portion of the first gate insulator and the second gate insulator.

The first inclined portion of the first gate insulator may directly contact the second gate insulator.

The semiconductor layer may include an oxide semiconductor.

The first material may be indium.

A voltage may be applied to each of the first gate electrode and the light-blocking layer.

The voltage applied to the light-blocking layer may be substantially identical to the voltage applied to the first gate electrode.

According to another aspect of the disclosure, a display device may include a semiconductor layer comprising an active layer; a first gate insulator covering the active layer and disposed on the semiconductor layer; a first gate electrode disposed on the first gate insulator; a second gate insulator covering the first gate insulator and the first gate electrode; and a second gate electrode disposed on the second gate insulator, wherein a side surface of the first gate insulator comprises: a first inclined portion contacting a first surface of the semiconductor layer; and a second inclined portion contacting the first inclined portion and the first gate electrode, wherein the semiconductor layer comprises a first material, and the second inclined portion is at least partially covered by the first material, and a value obtained by dividing a shortest distance from a side surface of the first gate electrode to the second gate electrode by a shortest distance from an upper surface of the first gate electrode to the second gate electrode is equal to or greater than about 0.8.

The first gate insulator may include a second material, and the second gate insulator may include a third material different from the second material.

A permittivity of the third material may be greater than a permittivity of the second material.

The second material may be silicon oxide ($SiO_x$), and the third material may be one selected from a group consisting of: silicon nitride ($SiN_x$), silicon oxynitride (SiON), aluminum oxide ($AlO_x$), hafnium oxide ($HfO_x$), and zirconium oxide ($ZrO_x$).

The display device may further include a storage capacitor disposed between the first gate electrode and the second gate electrode.

Particulars of various embodiments are included in the detailed description and the accompanying drawings.

According to embodiments of the disclosure, a display device may include a gate insulator having a side surface including a first inclined portion having a gentle or slight inclination and a second inclined portion having a steep inclination, so that particles of a semiconductor layer are not sputtered on the first inclined portion and thus it is possible to prevent a short-circuit between the semiconductor layer and a gate electrode.

According to embodiments of the disclosure, it is possible to reduce a step height by a first gate insulator and a first gate electrode in a display device by adjusting side surfaces of a first inclined portion and a gate electrode to have gentle or slight inclinations.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
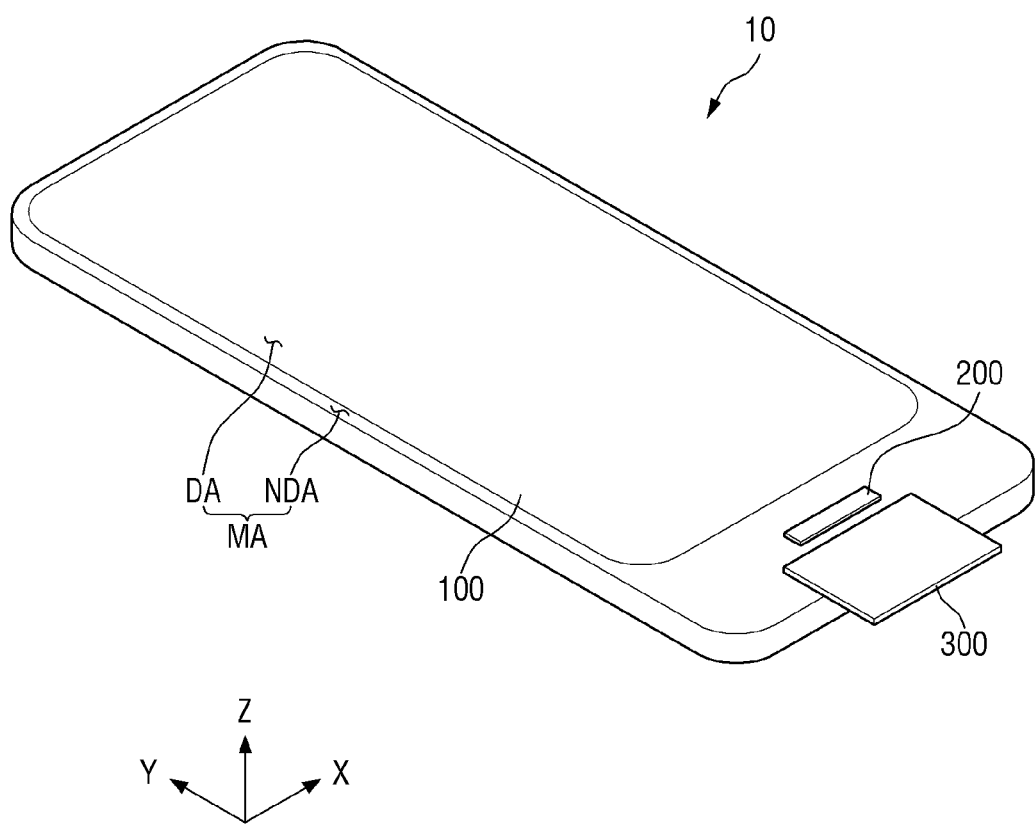
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The same reference numbers indicate the same components throughout the specification. In the attached figures, the thickness of layers and regions may be exaggerated for clarity. For example, in the drawings, sizes, thicknesses, ratios, and dimensions of the elements may be exaggerated for ease of description and for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
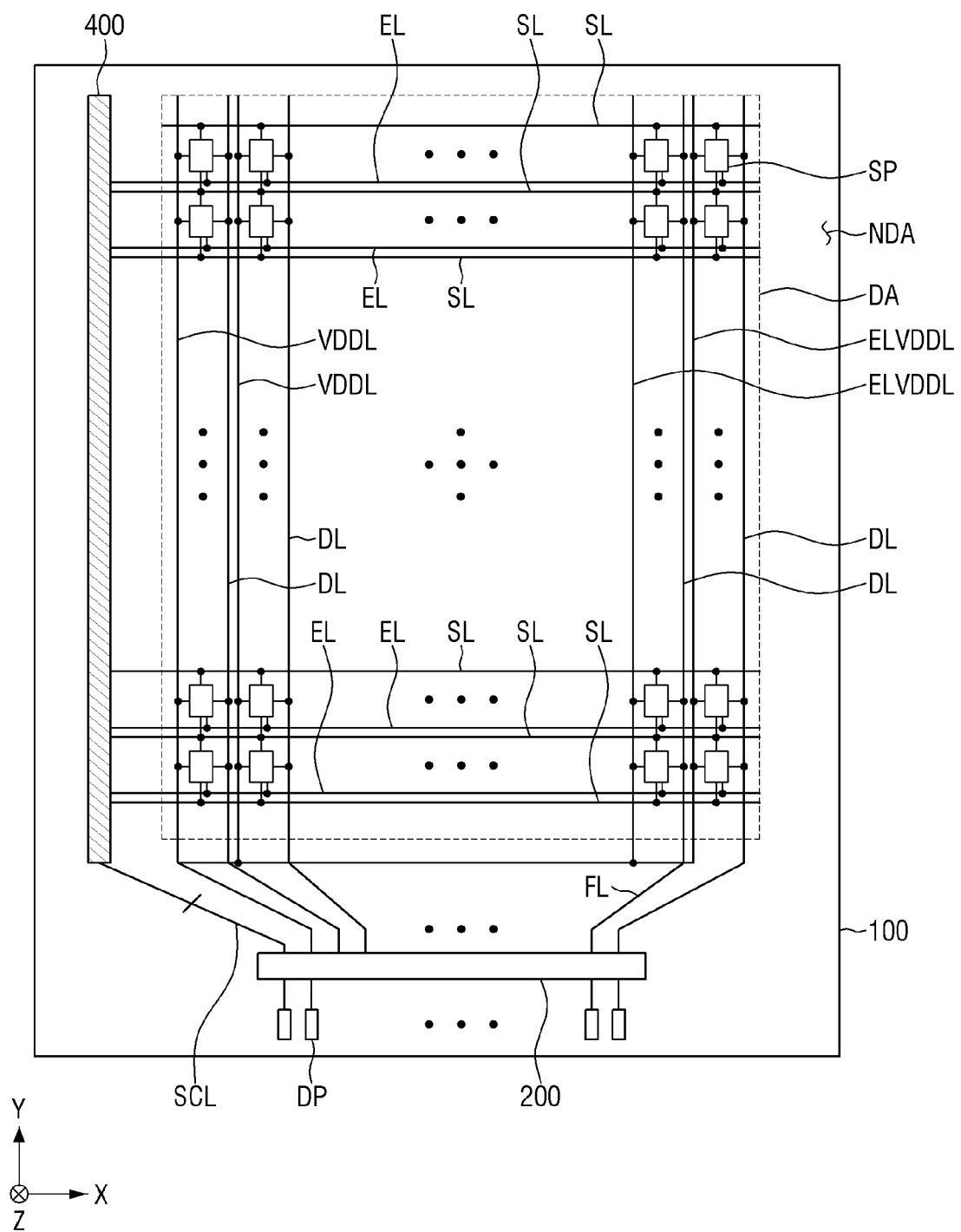
FIG. 2 is a schematic plan view showing a display device according to an embodiment.
Figure 3:
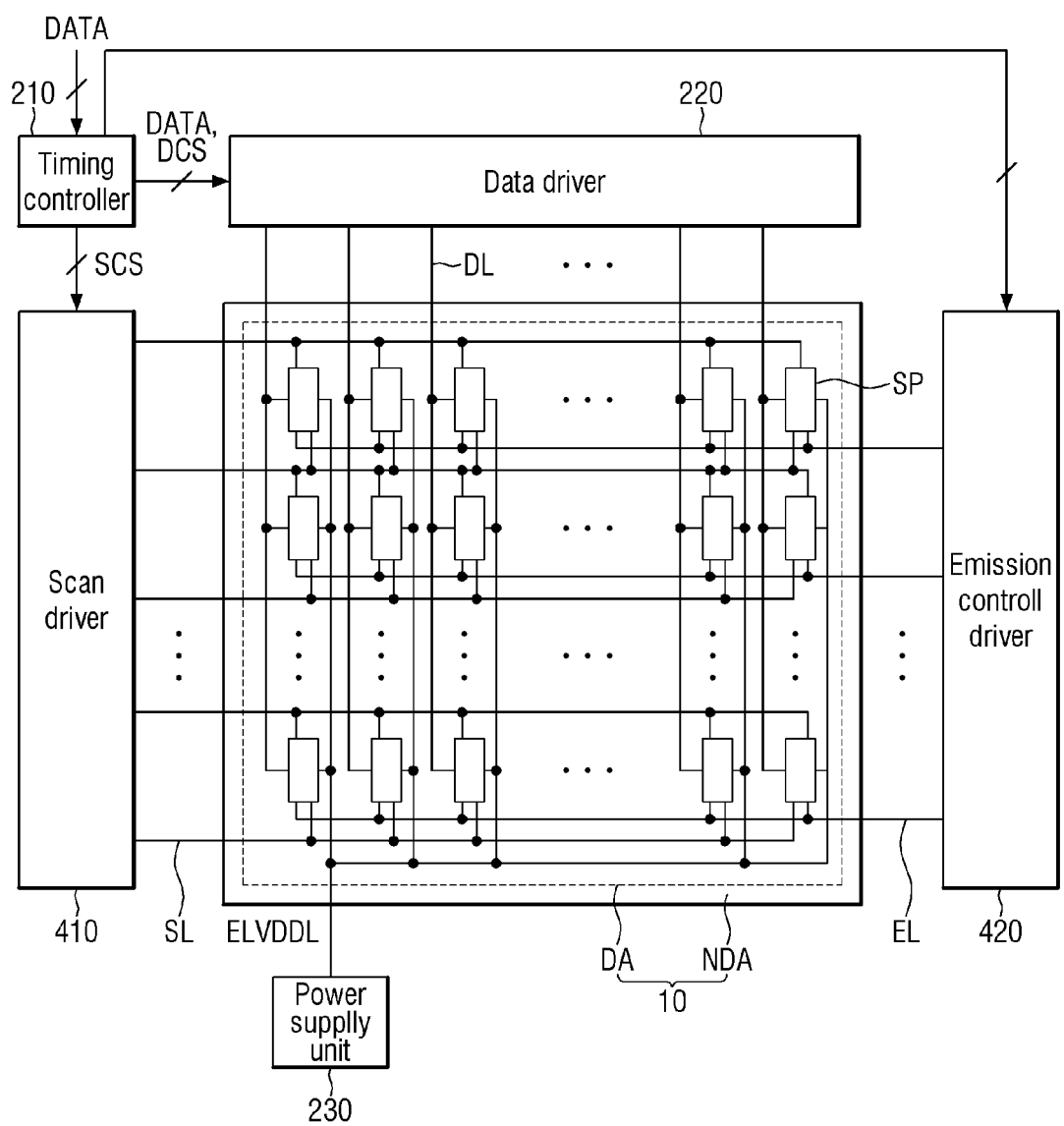
FIG. 3 is a block diagram showing a display device according to an embodiment.

FIG. 1 is a schematic perspective view of a display device according to an embodiment. FIG. 2 is a schematic plan view showing a display device according to an embodiment. FIG. 3 is a block diagram showing a display device according to an embodiment.

Referring to FIGS. 1 to 3, a display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and a micro light-emitting display device using micro light-emitting diodes (LED). In the following description, an organic light-emitting display device is described as an example of the display device 10. It is, however, to be understood that the disclosure is not limited thereto.

The display device 10 may include a display panel 100, a display driver circuit 200 and a circuit board 300.

The display panel 100 may be formed in a rectangular plane having shorter sides in a first direction (x-axis direction) and longer sides in a second direction (y-axis direction) intersecting the first direction (x-axis direction). Each of the corners where the shorter sides in the first direction (x-axis direction) meet the longer sides in the second direction (y-axis direction) may be rounded with a given curvature or may be a right angle. The shape of the display panel 100 in case that viewed from the top is not limited to a quadrangular shape, but may be formed in a different polygonal shape, a circular shape, or an elliptical shape. The display panel 100 may be, but is not limited to being, formed to be flat. The display panel 10 may include curved portions formed at left and right ends thereof and having a constant or varying curvature. The display panel 100 may be flexible so that it can be curved, bent, folded or rolled.

The display panel 100 may include a display area DA where sub-pixels SP are formed to display images, and a non-display area NDA which is the peripheral area of the display area DA. The display area DA and the non-display area NDA may be a main area MA. In the display area DA, scan lines SL, emission lines EL, data lines DL and supply voltage lines ELVDDL connected to the sub-pixels SP may be disposed, in addition to the sub-pixels SP. The scan lines SL and emission lines EL may be arranged or disposed in the first direction (x-axis direction), while the data lines DL may be arranged or disposed in the second direction (y-axis direction) intersecting the first direction (x-axis direction). The supply voltage lines ELVDDL may be arranged or disposed in parallel in the second direction (y-axis direction) in the display area DA. The supply voltage lines VDDL formed in parallel in the second direction (y-axis direction) in the display area DA may be connected to one another in the non-display area NDA.

Each of the sub-pixels SP may be connected to at least one of the scan lines SL, at least one of the data lines DL, at least one of the emission lines EL, and one of the supply voltage lines ELVDDL. In the example shown in FIG. 2, each of the sub-pixels SP is connected to two scan lines SL, one data line DL, one emission line EL, and one supply voltage line ELVDDL. It is, however, to be understood that the disclosure is not limited thereto. For example, each of the sub-pixels SP may be connected to three scan lines SL rather than two scan lines SL.

Each of the sub-pixels SP may include a driving transistor, at least one transistor, a light-emitting element 170, and a capacitor. The transistor may be turned on in response to a scan signal from a scan line SL, so that the data voltage DATA from the data line DL may be applied to the gate electrode of the driving transistor DT, for example, the first transistor T1. In case that the data voltage DATA is applied to the gate electrode, the driving transistor DT may supply a driving current to the light-emitting element 170, so that light can be emitted. The driving transistor DT and the at least one transistor may be thin-film transistors. The light-emitting element 170 may emit light in proportion to the driving current from the driving transistor DT. The light-emitting element 170 may be an organic light-emitting diode including a first electrode, an organic emitting layer 172, and a second electrode. The capacitor can keep the data voltage DATA applied to the gate electrode of the driving transistor DT constant.

The non-display area NDA may be defined as the area from the outer side of the display area DA to the edge of the display panel 100. In the non-display area NDA, a scan driving circuit 400 for applying scan signals to the scan lines SL, fan-out lines FL between the data lines DL and the display driving circuit 200, and the pads DP connected to the display driving circuit 200 may be disposed. The display driving circuit 200 and the pads DP may be disposed at the edge or an edge on one side or a side of the display panel 100. The pads DP may be disposed closer to the edge on the side of the display panel 100 than the display driving circuit 200.

The scan driving circuit 400 may be connected to the display driving circuit 200 through scan control lines SCL. The scan driving circuit 400 may receive a scan control signal SCS and an emission control signal EM from the display driving circuit 200 through the scan control lines SCL.

The scan driving circuit 400 may include a scan driver 410 and an emission control driver 420 as shown in FIG. 3.

The scan driver 410 may generate scan signals according to the scan control signal SCS and may sequentially output the scan signals to the scan lines SL. The emission control driver 420 may generate the emission control signals EM according to the emission control signal EM and may sequentially output the emission control signals EM to the emission lines EL.

The scan driving circuit 400 may include thin-film transistors. The scan driving circuit 400 may be formed in a same layer as the thin-film transistors of the sub-pixels pixels SP. Although the scan driving circuit 400 is formed on a side of the display area DA, for example, in the non-display area on the left side of the display area DA in FIG. 2, the disclosure is not limited thereto. For example, the scan driving circuit 400 may be formed on both side of the display area DA, for example, in the non-display area NDA on the left side as well as right side of the display area DA.

The display driving circuit 200 may include a timing controller 210, a data driver 220, and a power supply circuit 230 as shown in FIG. 3.

The timing controller 210 receives digital video data DATA and timing signals from the circuit board 300. The timing controller 210 may generate the scan control signal SCS for controlling the operation timing of the scan driver 410 according to the timing signals, may generate the emission control signal EM for controlling the operation timing of the emission control driver 420 and may generate the data control signal DCS for controlling the operation timing of the data driver 220. The timing controller 210 may output the scan control signal SCS to the scan driver 410 through the scan control lines SCL and the emission control signal EM to the emission control driver 420. The timing controller 210 may output the digital video data DATA and the data control signal DCS to the data driver 220.

The data driver 220 converts the digital video data DATA into analog positive/negative data voltages DATA and supplies them to the data lines DL through the fan-out lines FL. Sub-pixels SP are selected by the scan signals of the scan driving circuit 400, and data voltages DD are supplied to the selected sub-pixels SP.

The power supply circuit 230 may generate a first driving voltage to supply it to the supply voltage line ELVDDL. The power supply circuit 230 may generate a second driving voltage to supply it to the cathode electrodes of the organic light-emitting emitting diode of each of the sub-pixels SP. The first driving voltage may be a high-level voltage for driving the organic light-emitting diode, and the second driving voltage may be a low-level voltage for driving the organic light-emitting diode. For example, the first driving voltage may have a higher level than that of the second driving voltage.

The display driving circuit 200 may be implemented as an integrated circuit (IC) and may be attached to the display panel 10 by a chip on glass (COG) technique, a chip on plastic (COP) technique, or an ultrasonic bonding. It is, however, to be understood that the disclosure is not limited thereto. For example, the display driving circuit 200 may be attached to the circuit board 300.

The circuit board 300 may be attached to the pads DP using an anisotropic conductive film. In this manner, the lead lines of the circuit board 300 may be electrically connected to the pads DP. The circuit board 300 may be a flexible printed circuit board, a printed circuit board, or a flexible film such as a chip-on-film.

Figure 4:
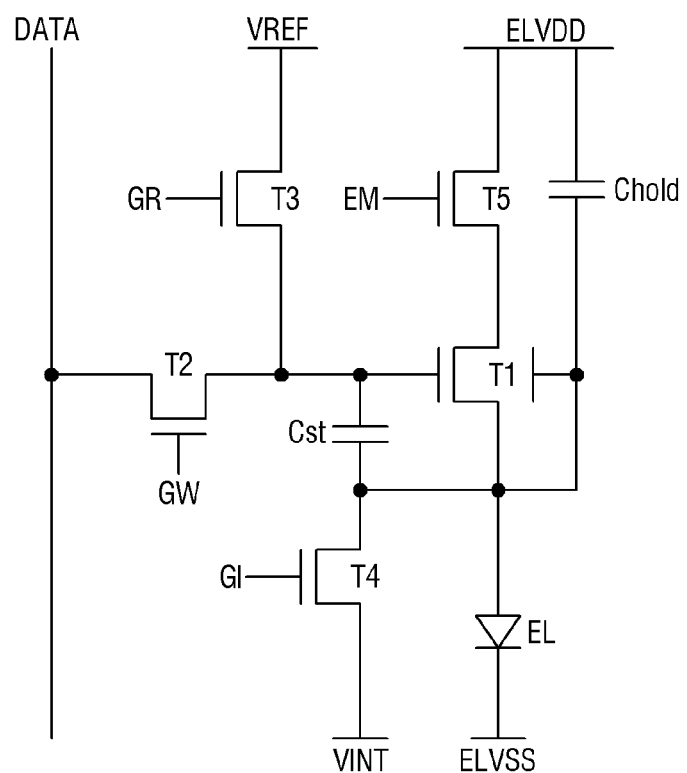
FIG. 4 is a schematic diagram of an equivalent circuit showing a sub-pixel according to an embodiment.

FIG. 4 is a schematic diagram of an equivalent circuit showing a sub-pixel according to an embodiment.

Referring to FIG. 4, the sub-pixel SP may include five transistors T1 to T5, a storage capacitor Cst, a hold capacitor Chold, and a light-emitting element 170.

A first electrode D1 of the first transistor T1 may be connected to a second electrode S5 of the fifth transistor T5, and a second electrode S1 of the first transistor T1 may be connected to an anode electrode of the light-emitting element 170, a first electrode D4 of the fourth transistor T4, and a first light-blocking layer BML1. A (1_1) gate electrode of the first transistor T1 may be connected to a first electrode D3 of the third transistor T3 and a second electrode S2 of the second transistor T2.

The data voltage DATA may be applied to a first electrode D2 of the second transistor T2, and a second electrode S2 of the second transistor T2 may be connected to a first electrode D3 of the third transistor T3 and the (1_1) gate electrode of the first transistor T1. A second control signal GW may be applied to a second gate electrode G2 of the second transistor T2. The second transistor T2 may be turned on by the second control signal GW so that it works as a passage to allow the data voltage DATA to be applied to the (1_1) gate electrode G1-1 of the first transistor T1.

The first electrode D3 of the third transistor T3 may be connected to the second electrode S2 of the second transistor T2 and the (1-1) gate electrode G1-1 of the first transistor T1. A reference voltage VREF may be applied to the second electrode S3 of the third transistor T3, and a first control signal GR may be applied to a third gate electrode G3 of the third transistor T3. The third transistor T3 may be turned on by the first control signal GR so that it works as a passage to allow the reference voltage VREF to be applied to the (1_1) gate electrode G1-1 of the first transistor T1.

The first electrode D4 of the fourth transistor T4 may be connected to the anode electrode of the light-emitting element 170, the second electrode S1 of the first transistor T1, and the first light-blocking layer BML1. An initialization voltage VINT may be applied to the second electrode S4 of the fourth transistor T4, and a third control signal GI may be applied to a fourth gate electrode G4 of the fourth transistor T4. The fourth transistor T4 may be turned on by the third control signal GI so that it works as a passage to allow the initialization voltage VINT to be applied to the second electrode S1 of the first transistor T1.

A supply voltage ELVDD may be applied to the first electrode D5 of the fifth transistor T5, and the second electrode S5 of the fifth transistor T5 may be connected to the first electrode D1 of the first transistor T1. The first control signal GR may be applied to the fifth gate electrode G5 of the fifth transistor T5. The fifth transistor T5 may be turned on by the emission control signal EM so that it works as a passage to allow the supply voltage ELVDD to be applied to the first electrode D1 of the first transistor T1.

The first transistor T1 may be a driving transistor, the first electrode of each of the first to fifth transistors T1, T2, T3, T4 and T5 may be a drain electrode, and the second electrode may be a source electrode. It should be understood, however, that the disclosure is not limited thereto. For example, in case that the first electrode of each of the first to fifth transistors T1, T2, T3, T4 and T5 is the drain electrode, the second electrode thereof may be the source electrode, and vice versa. Although each of the transistors is depicted according to a single transistor in the drawing, it may be implemented as a dual transistor.

Although each of the first to fifth transistors T1, T2, T3, T4 and T5 is implemented as an n-type MOSFET in FIG. 4, the disclosure is not limited thereto. Each of the first to fifth transistors T1, T2, T3, T4 and T5 may be implemented as a p-type MOSFET.

A drain-source current (hereinafter referred to as "driving current") of the first transistor T1 is controlled according to the data voltage DATA applied to the gate electrode.

The light-emitting element 170 emits light as the driving current flows therein. The amount of the light emitted from the light-emitting element 170 may be proportional to the driving current.

The light-emitting element 170 may be an organic light-emitting diode including an anode electrode, a cathode electrode, and an organic emitting layer 172 disposed between the anode electrode and the cathode electrode. For example, the light-emitting element 170 may be an inorganic light-emitting element including an anode electrode, a cathode electrode, and an inorganic semiconductor disposed between the anode electrode and the cathode electrode. For example, the light-emitting element 170 may be a quantum-dot light-emitting element including an anode electrode, a cathode electrode, and a quantum-dot emissive layer disposed between the anode electrode and the cathode electrode. For example, the light-emitting element 170 may be a micro light-emitting diode.

The anode electrode of the light-emitting element 170 may be connected to the first electrode D4 of the fourth transistor T4 and the second electrode S1 of the first transistor T1, and a ground voltage ELVSS may be applied to the cathode electrode.

A first electrode of the storage capacitor Cst is connected to the (1-1) gate electrode G1-1 of the first transistor T1, and a second electrode thereof is connected to a (1-2) gate electrode G1-2 of the first transistor T1. The storage capacitor Cst may store the data voltage DATA transferred by the second transistor T2, but the disclosure is not limited thereto.

The supply voltage ELVDD may be applied to the first electrode of the hold capacitor Chold, and the second electrode may be connected to the first light-blocking layer BML1 of the first transistor T1. The hold capacitor Chold can prevent a sudden change in a voltage difference between the supply voltage ELVDD and the first light-blocking layer BML1 of the first transistor T1.

Figure 5:
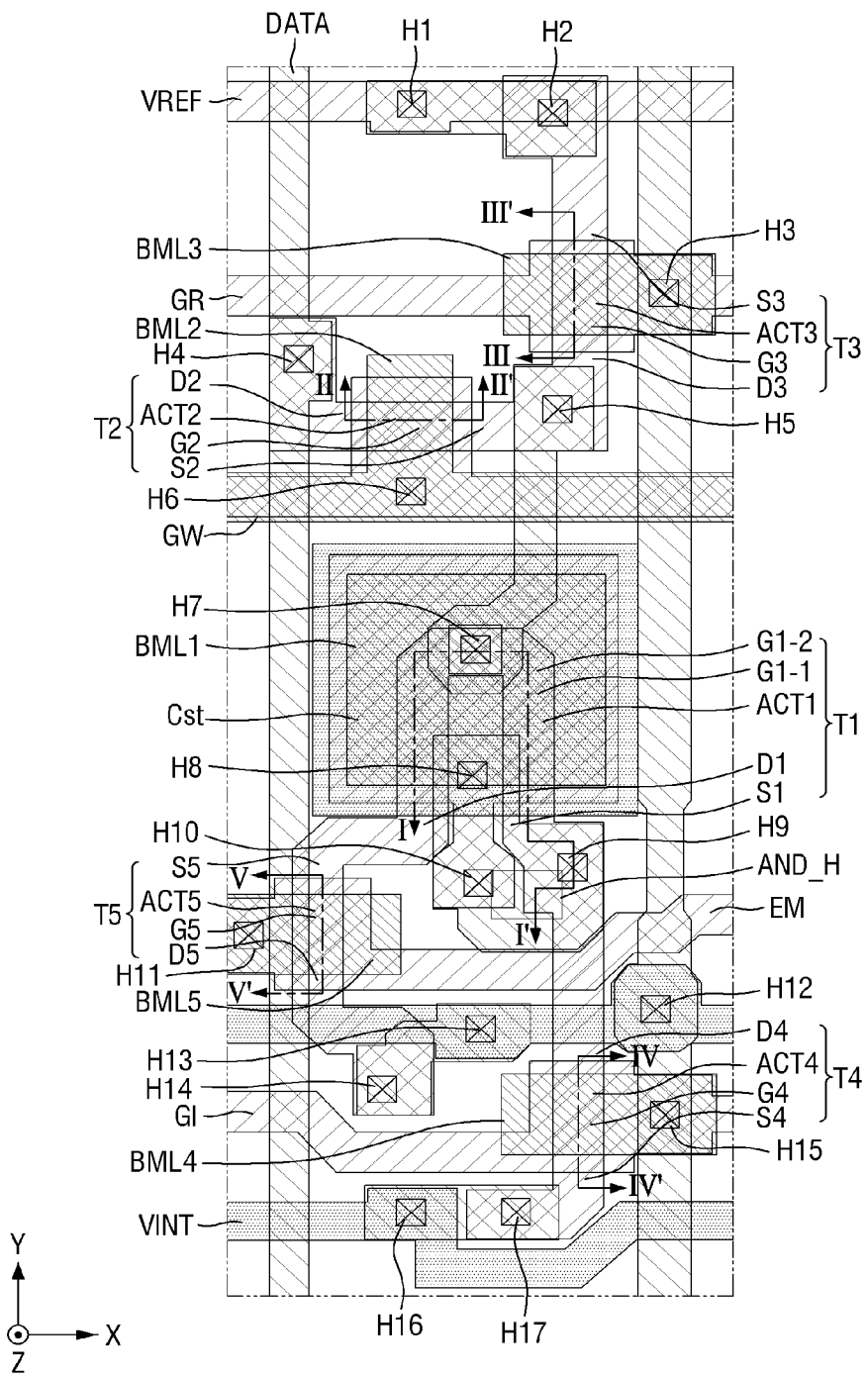
FIG. 5 is a schematic plan view showing sub-pixels according to an embodiment.
Figure 6:
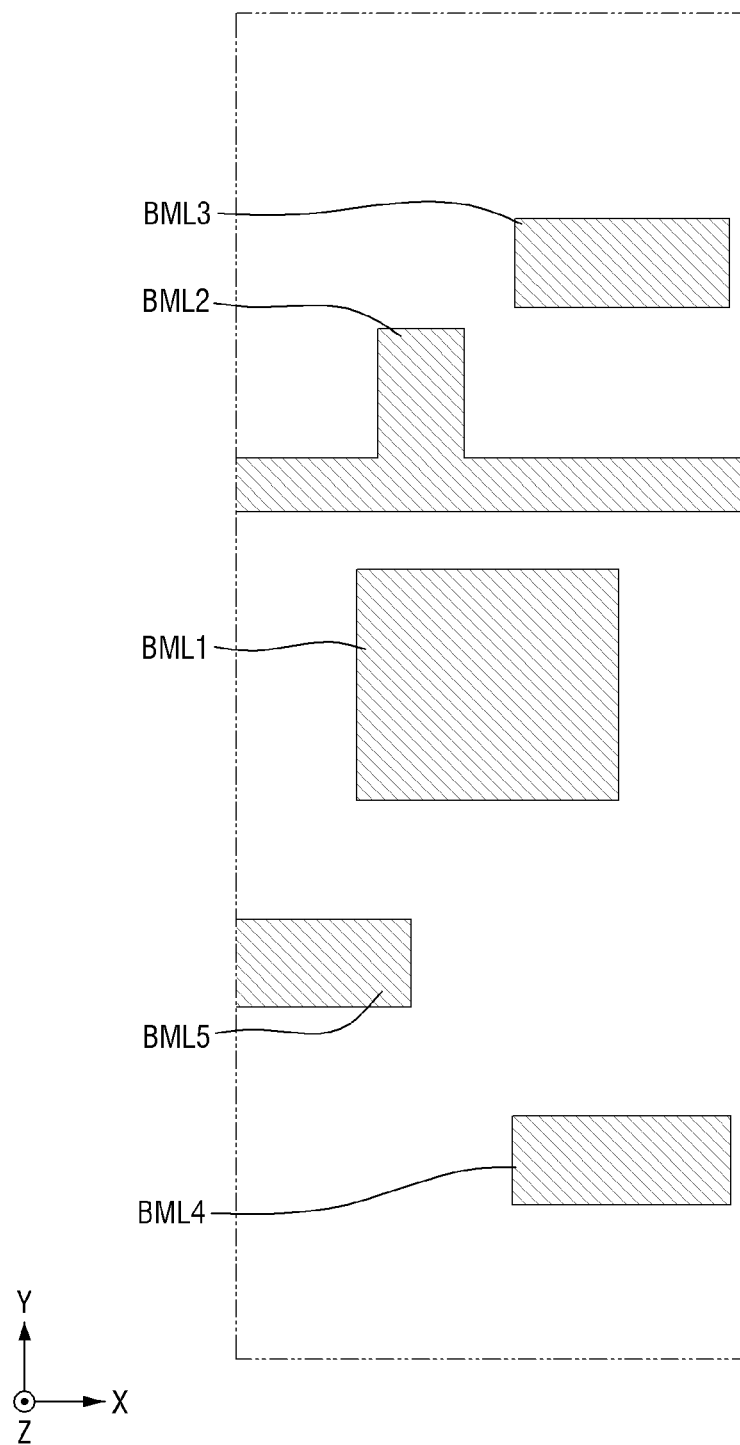
FIG. 6 is a schematic plan view showing only the light-blocking layer in the schematic plan view of FIG. 5.
Figure 7:
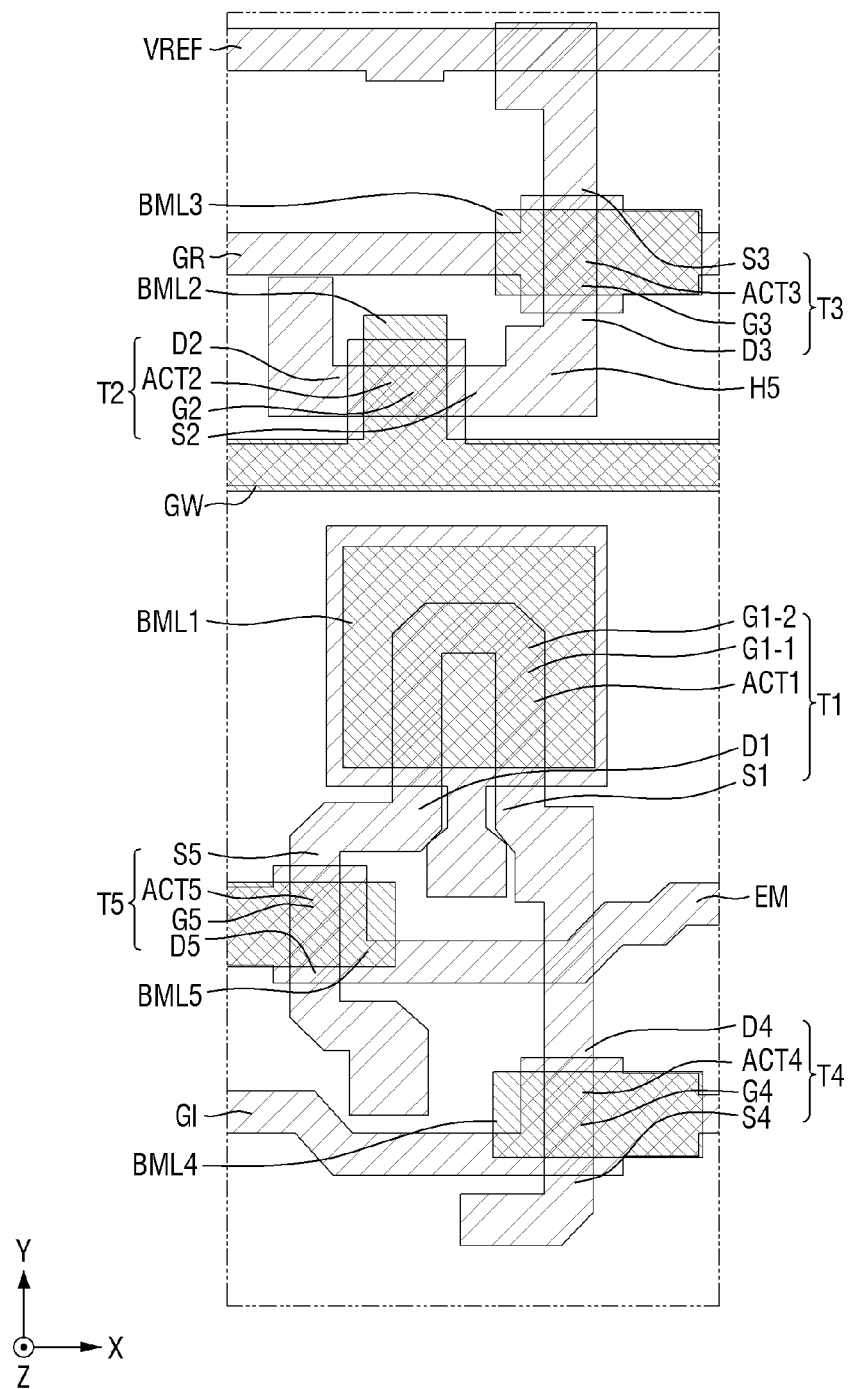
FIG. 7 is a schematic plan view showing the light-blocking layer, the semiconductor layer, and the gate layer in the schematic plan view of FIG. 5.
Figure 8:
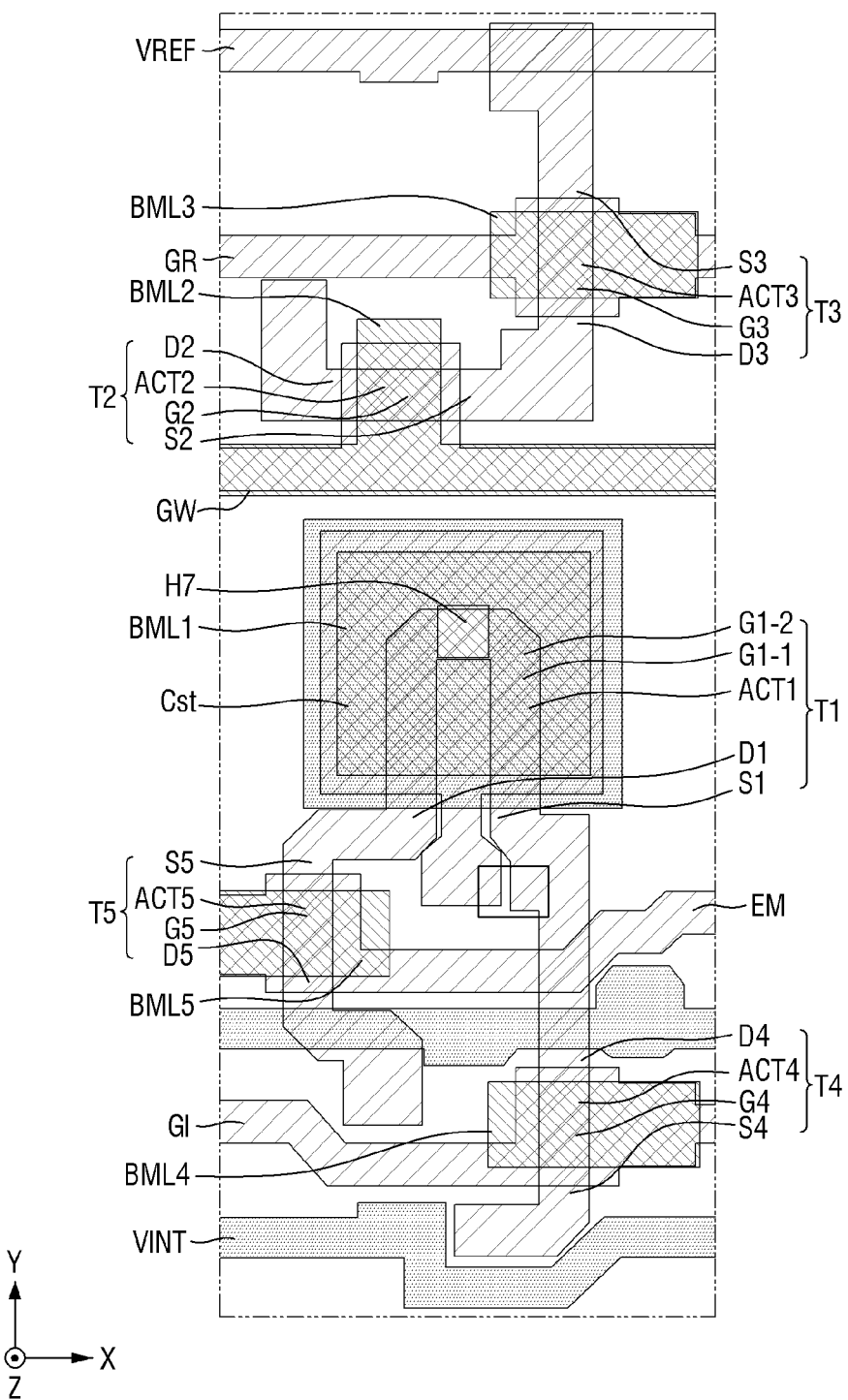
FIG. 8 is a schematic plan view showing the light-blocking layer, the semiconductor layer, the gate layer, and a (1-2) gate layer in the schematic plan view of FIG. 5.
Figure 9:
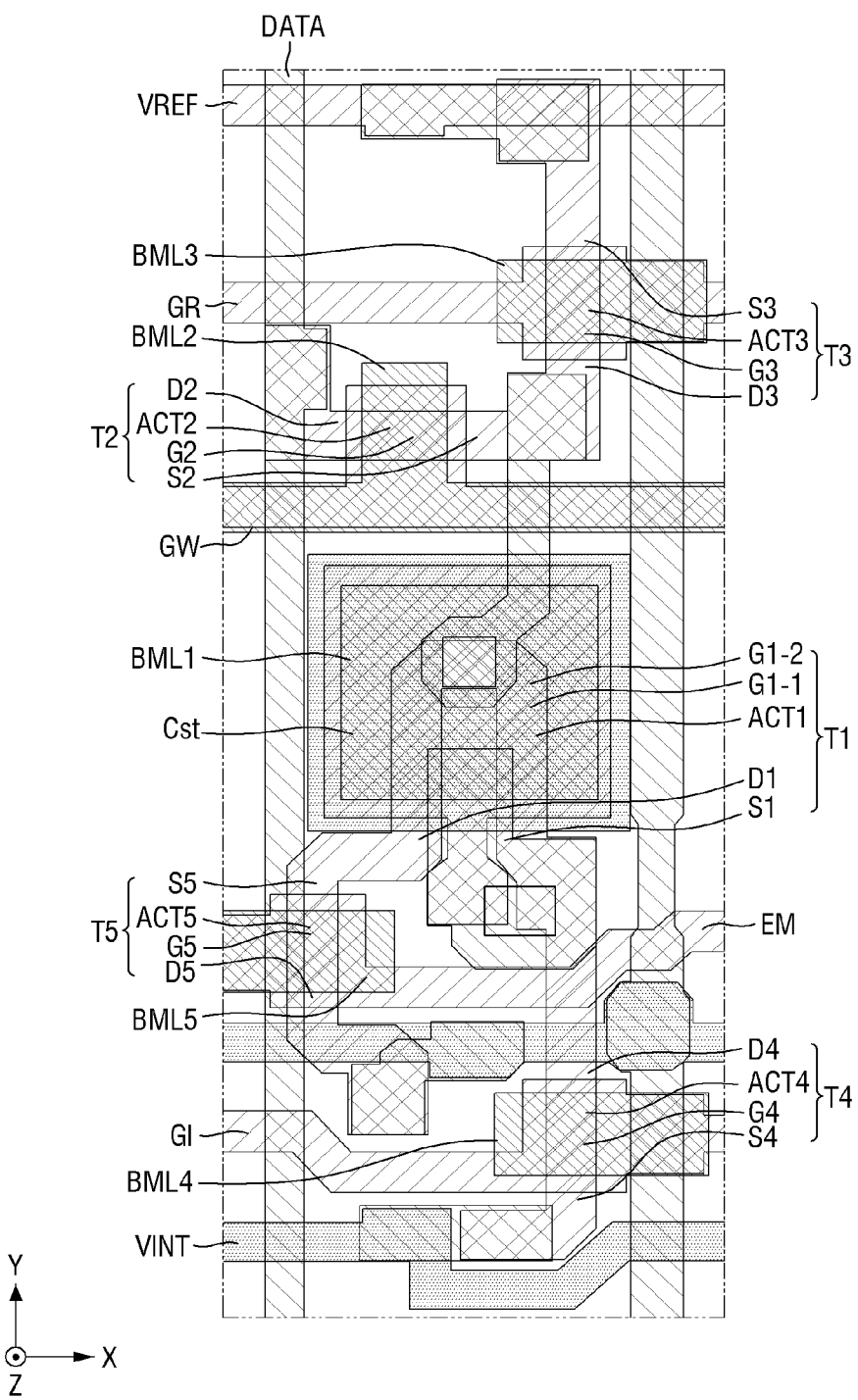
FIG. 9 is a schematic plan view showing the light-blocking layer, the semiconductor layer, the gate layer, the (1-2) gate layer and the data layer in the schematic plan view of FIG. 5.

FIG. 5 is a schematic plan view showing sub-pixels according to an embodiment. FIG. 6 is a schematic plan view showing only the light-blocking layer in the schematic plan view of FIG. 5. FIG. 7 is a schematic plan view showing the light-blocking layer, the semiconductor layer, and the gate layer in the schematic plan view of FIG. 5. FIG. 8 is a schematic plan view showing the light-blocking layer, the semiconductor layer, the gate layer, and a (1-2) gate layer in the schematic plan view of FIG. 5. FIG. 9 is a schematic plan view showing the light-blocking layer, the semiconductor layer, the gate layer, the (1-2) gate layer and the data layer in the schematic plan view of FIG. 5.

Referring to FIGS. 5 to 9, a sub-pixel SP may include first to fifth transistors T1, T2, T3, T4 and T5.

The first transistor T1 may include a first active layer ACT1, a first electrode D1 of the first transistor T1, a second electrode S1 of the first transistor T1, a (1-1) gate electrode G1-1 and a (1-2) gate electrode G1-2. The first active layer ACT1 of the first transistor T1, the first electrode D1 of the first transistor T1 and the second electrode S1 of the first transistor T1 may be formed on a same plane, and the first active layer may overlap the (1-1) gate electrode G1-1. The (1-2) gate electrode G1-2 may be disposed on the (1-1) gate electrode G1-1. The (1-1) gate electrode G1-1 may overlap the first active layer ACT1, and the first electrode D1 of the first transistor T1 may be connected to the second electrode S5 of the fifth transistor T5. The second electrode S1 of the first transistor T1 may be connected to the first electrode D4 of the fourth transistor T4, and may be connected to a connection electrode VIE through a ninth contact hole H9.

The second transistor T2 may include a second active layer ACT2, a first electrode D2 of the second transistor T2, a second electrode S2 of the second transistor T2, and a second gate electrode G2. The second active layer ACT2 of the second transistor T2, the first electrode D2 of the second transistor T2 and the second electrode S2 of the second transistor T2 may be formed on a same plane, and the second active layer may overlap the second gate electrode G2. The second gate electrode G2 may overlap the second active layer ACT2, and the first electrode D2 of the second transistor T2 may be connected to the data line DL through a fourth contact hole H4. The second electrode S2 of the second transistor T2 may be connected to the first electrode D3 of the third transistor T3, and may be connected to the connection electrode VIE through a fifth contact hole H5.

The third transistor T3 may include a third active layer ACT3, the first electrode D3 of the third transistor T3, the second electrode S3 of the third transistor T3, and the third gate electrode G3. The third active layer ACT3 of the third transistor T3, the first electrode D3 of the third transistor T3 and the second electrode S3 of the third transistor T3 may be formed on a same plane, and the third active layer may overlap the third gate electrode G3. The third electrode G3 of the third gate electrode G3 may overlap the third active layer ACT3, and the first electrode D3 of the third transistor T3 may be connected to the second electrode S2 of the second transistor T2 and may be connected to the connection electrode VIE through a fifth contact hole H5. The second electrode S3 of the third transistor T3 may be connected to the connection electrode VIE through a second contact hole H2.

The fourth transistor T4 may include a fourth active layer ACT4, the first electrode D4 of the fourth transistor T4, the second electrode S4 of the fourth transistor T4, and the fourth gate electrode G4. The fourth active layer ACT4 of the fourth transistor T4, the first electrode D4 of the fourth transistor T4 and the second electrode S4 of the fourth transistor T4 may be formed on a same plane, and the fourth active layer may overlap the fourth gate electrode G4. The fourth gate electrode G4 may overlap the fourth active layer ACT4, and the first electrode D4 of the fourth transistor T4 may be connected to the second electrode S1 of the first transistor T1 and may be connected to the connection electrode VIE through the ninth contact hole H9. The second electrode S4 of the fourth transistor T4 may be connected to the connection electrode VIE through a seventeenth contact hole H17.

The fifth transistor T5 may include a fifth active layer ACT5, the second electrode S5 of the fifth transistor T5, the second electrode S5 of the fifth transistor T5, and the fifth gate electrode G5. The fifth active layer ACT5 of the fifth transistor T5, the first electrode D5 of the fifth transistor T5 and the second electrode S5 of the fifth transistor T5 may be formed on a same plane, and the fifth active layer may overlap the fifth gate electrode G5. The fifth gate electrode G5 may overlap the fifth active layer ACT5, and the first electrode D5 of the fifth transistor T5 may be connected to the connection electrode VIE through a fourteenth contact hole H14. The second electrode S5 of the fifth transistor T5 may be connected to the first electrode D1 of the first transistor T1.

Figure 10:
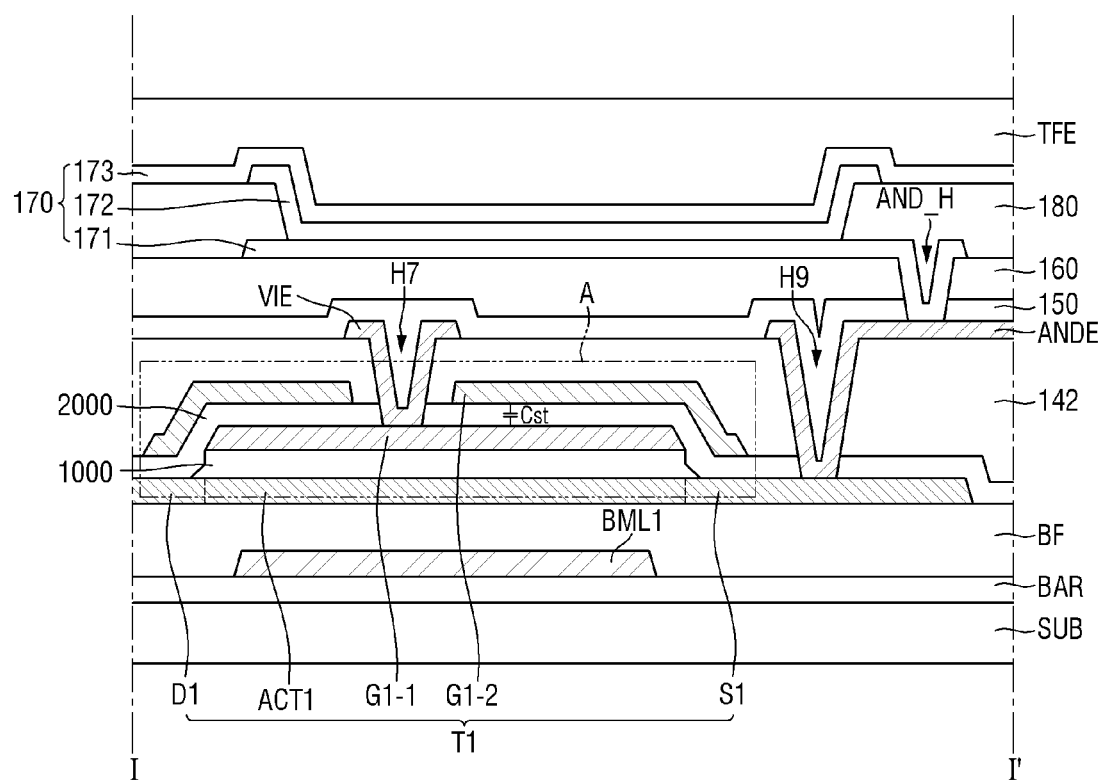
FIG. 10 is a schematic cross-sectional view taken along line I-I' of FIG. 5.

The first contact hole H1 may connect the connection electrode VIE thereon with a reference voltage VREF line thereunder. The second contact hole H2 may connect the connection electrode VIE thereon with the second electrode S3 of the third transistor T3 thereunder. The third contact hole H3 may connect a first control signal GR line thereon with a third light-blocking layer BML3 thereunder. The fourth contact hole H4 may connect a data voltage line thereon with the first electrode D2 of the second transistor T2 thereunder. The fifth contact hole H5 may connect the connection electrode VIE thereon with the second electrode S2 of the second transistor T2 and the first electrode D3 of the third transistor T3 thereunder. A sixth contact hole H6 may connect a second control signal GW line thereon with a second light-blocking layer BML2 thereunder. A seventh contact hole H7 may connect the connection electrode VIE thereon with the (1-1) gate electrode G1-1 of the first transistor T1 thereunder. An eighth contact hole H8 may connect the connection electrode VIE thereon with a reference voltage VREF line thereunder. The ninth contact hole H9 may connect the connection electrode VIE thereon with the second electrode S1 of the first transistor T1 and the first electrode D4 of the fourth transistor T4 thereunder. A tenth contact hole H10 may connect the connection electrode VIE thereon with the (1-1) gate electrode G1-1 of the first transistor T1 thereunder. An eleventh contact hole H11 may connect an emission control signal line thereon with a fifth light-blocking layer BML5 thereunder. A twelfth contact hole H12 may connect a horizontal supply voltage line ELVDDL thereon with a vertical supply voltage line ELVDDL thereunder. A thirteenth contact hole H13 may connect the connection electrode VIE thereon with the horizontal supply voltage line ELVDDL. The fourteenth contact hole H14 may connect the connection electrode VIE thereon with the first electrode D5 of the fifth transistor T5 thereunder. A fifteenth contact hole H15 may connect a third control signal line thereon with a fourth light-blocking layer BML4 thereunder. A sixteenth contact hole H16 may connect the connection electrode VIE thereon with an initialization voltage line VINT thereunder. The seventeenth contact hole H17 may connect the connection electrode VIE thereon with the second electrode S4 of the fourth transistor T4 thereunder. In case that the second transistor T2 is turned on, the data voltage DATA may be applied to the (1-1) gate electrode G1-1, and a same voltage as the (1-1) gate electrode G1-1 may be applied to the first light-blocking layer BML1 by the eighth contact hole H8, the tenth contact hole H10 and the connection electrode VIE. The second control signal GW may be applied to the second gate electrode G2, and the second control signal GW may also be applied to the second light-blocking layer BML2. The first control signal GR may be applied to the third gate electrode G3, and the first control signal GR may also be applied to the third light-blocking layer BML3. The third control signal GI may be applied to the fourth gate electrode G4, and the third control signal GI may also be applied to the fourth light-blocking layer BML4. The emission control signal EM may be applied to the fifth gate electrode G5, and the emission control signal EM may also be applied to the fifth light-blocking layer BML5. For example, by applying a same voltage as that of the gate electrode to each light-blocking layer, each of the first to fifth transistors T1, T2, T3, T4 and T5 is implemented as a double-gate transistors in which the gate electrodes are disposed above and below the active layer. In other words, the light-blocking layer disposed under or below each transistor may work not only as a light-blocking layer but also as a gate electrode. Although the first to fifth transistors T1, T2, T3, T4 and T5 are implemented as double-gate transistors in the foregoing description, the disclosure is not limited thereto. The first electrode, the active layer and the second electrode of each of the first to fifth transistors T1, T2, T3, T4 and T5 may include an oxide semiconductor. Oxide semiconductor may include at least one of: mono metal oxide such as indium oxide (In), tin oxide (Sn) and zinc oxide (Zn); binary metal oxide such as In—Zn oxide, Sn—Zn oxide, Al—Zn oxide, Zn—Mg oxide, Sn—Mg oxide, In—Mg oxide and In-Gate oxide; ternary metal oxide such as In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide and In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide and In—Lu—Zn oxide; and quaternary metal oxide such as In—Sn—Ga—Zn oxide, In—Hf—Ga—Zn oxide, In—Al—Ga—Zn oxide, In—Sn—Al—Zn oxide, In—Sn—Hf—Zn oxide and In—Hf—Al—Zn oxide. For example, the oxide semiconductor may include indium-gallium-zinc oxide (IGZO) among the above-listed In—Ga—Zn oxides. FIG. 10 is a schematic cross-sectional view taken along line I-I' of FIG. 5. Referring to FIG. 10, a thin-film transistor layer TFTL, the light-emitting element layer EML, and an encapsulation layer TFE may be sequentially formed on a first substrate-SUB.

The thin-film transistor layer TFTL may include a buffer film BF, a semiconductor layer SEM, a first gate insulator, a (1-1) gate electrode G1-1, a second gate insulator 2000, a (1-2) gate electrode G1-2, a data metal layer DTL, a protective film 150, and a planarization film 160. The semiconductor layer SEM may include a first electrode, a first active layer ACT1 and a second electrode.

A protection member BAR may be formed on one surface or a surface of the substrate, and the first light-blocking layer BML1 may be formed on one surface or a surface of the protection member BAR. The first light-blocking layer BML1 may overlap a channel region of the first active layer ACT1. It is possible to prevent the light incident from the substrate SUB from being incident on the channel region of the first active layer ACT1 by virtue of the first light-blocking layer BML1. In this manner, it is possible to prevent leakage current which otherwise may flow to the channel region of the first active layer ACT1 due to the light.

According to an embodiment, the first light-blocking layer BML1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The protection member BAR may be eliminated.

A buffer film BF may be formed on one surface or a surface of the light-blocking layer and the protection member BAR. The buffer film BF can protect the first thin-film transistor and the organic emitting layer 172 of the light-emitting element layer EML from moisture that is likely to permeate through the substrate SUB. The buffer layer BF may be formed of inorganic layers alternately stacked each other. For example, the buffer layer BF may be made up of multiple layers in which one or more inorganic layers of a silicon nitride layer, a silicon oxynitride layer, a silicon oxide layer, a titanium oxide layer and an aluminum oxide layer may be alternately stacked each other. The buffer film BF may be eliminated.

The semiconductor layer SEM may be formed on the buffer film BF. The semiconductor layer SEM may include polycrystalline silicon, single crystal silicon, low-temperature polycrystalline silicon, amorphous silicon, or an oxide semiconductor.

The first gate insulator may be formed on the semiconductor layer SEM. The gate insulating film 1000,2000 may include one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$). A side surface of the first gate insulator may include a first inclined portion 1001 and a second inclined portion 1002 having different inclinations. The shape of the first gate insulator will be described later in detail with reference to FIGS. 15 and 16.

A (1-1) gate electrode G1-1 may be formed on the first gate insulator. The (1-1) gate electrode G1-1 may include one of molybdenum (Mo), aluminum (Al), chromium (Cr), gold (Au), titanium (Ti), nickel (Ni), neodymium (Nd) and copper (Cu). For example, the (1-1) gate electrode G1-1 may be made up of a single layer or multiple layers made of an alloy thereof.

A second gate insulator 2000 may be formed on the (1-1) gate electrode G1-1. The second gate insulator 2000 may include a high-k material. For example, the second gate insulator 2000 may include one of silicon nitride ($SiN_x$), silicon oxynitride (SiON), aluminum oxide ($AlO_x$), hafnium oxide ($HfO_x$), and zirconium oxide ($ZrO_x$) The second gate insulator 2000 may include inorganic films.

A second gate electrode G2 may be formed on the second gate insulator 2000. The second gate electrode G2 may include one of molybdenum (Mo), aluminum (Al), chromium (Cr), gold (Au), titanium (Ti), nickel (Ni), neodymium (Nd) and copper (Cu). For example, the second gate electrode G2 may be made up of a single layer or multiple layers made of an alloy thereof.

An interlayer dielectric film 142 may be formed on the second gate electrode G2. The interlayer dielectric film 142 may include one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$) The interlayer dielectric film 142 may include a number of inorganic films.

A data metal layer DTL may be formed on the interlayer dielectric film 142. The data metal layer DTL may include an anode connection electrode ANDE and a connection electrode VIE. The data gate electrode DTL may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A planarization film 160 may be formed on the data metal layer DTL to provide a flat surface over the elements having different heights. The planarization film 160 may be formed of an organic layer such as an acryl resin, an epoxy resin, a phenolic resin, a polyamide resin and a polyimide resin.

The protective film 150 may be further formed between the data metal layer DTL and the planarization film 160. The protective film 150 may be formed of, for example, one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$).

The seventh contact hole H7 may penetrate the second gate insulator 2000, the second gate electrode G2 and the interlayer dielectric film 142 to expose the (1-1) gate electrode G1-1 as shown in FIG. 10. The (1-1) gate electrode G1-1 of the first transistor T1 may be connected to the connection electrode VIE through a seventh contact hole H7.

A ninth contact hole H9 may penetrate through the second gate insulator 2000 and the interlayer dielectric film 142 to expose the first light-blocking layer BML1. The first light-blocking layer BML1 may be connected to the anode connection electrode ANDE through the ninth contact hole H9.

An anode contact hole may penetrate through the protective film 150 and the planarization film 160 to expose the anode connection electrode ANDE.

In the top-emission organic light-emitting diode that light exits from the organic emitting layer 172 toward the second light-emitting electrode 173, the first light-emitting electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The pixel-defining film 180 may be formed on the planarization film 160 to partition the first light-emitting electrode 171 in order to define an emission area of each of the sub-pixels SP. The pixel-defining film 180 may be formed to cover the edge of the first light-emitting electrode 171. The pixel-defining film 180 may be formed of an organic layer such as an acryl resin, an epoxy resin, a phenolic resin, a polyamide resin and a polyimide resin.

In the emission area of each of the sub-pixels SP, the first light-emitting electrode 171, the organic emitting layer 172 and the second light-emitting electrode 173 may be stacked each other sequentially, so that holes from the first light-emitting electrode 171 and electrons from the second light-emitting electrode 173 are combined with each other in the organic emitting layer 172 to emit light.

The organic emitting layer 172 is formed on the first light-emitting electrode 171 and the pixel-defining layer 180. The organic emitting layer 172 may include an organic material and emit light of a particular color. For example, the organic emitting layer 172 may include a hole transporting layer, an organic material layer, and an electron transporting layer.

The second light-emitting electrode 173 is formed on the organic emitting layer 172. The second light-emitting electrode 173 may be formed to cover the organic emitting layer 172. The second light-emitting electrode 173 may be a common layer formed across the sub-pixels SP. A capping layer may be formed on the second light-emitting electrode 173.

In the top-emission organic light-emitting diode, the second light-emitting electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In case that the second light-emitting electrode 173 is formed of a semi-transmissive conductive material, the light extraction efficiency can be increased by using microcavities.

The encapsulation layer TFE may be formed on the light-emitting element layer EML. The encapsulation layer TFE may include at least one inorganic film to prevent permeation of oxygen or moisture into the light-emitting element layer EML. The encapsulation layer TFE may include at least one organic film to protect the light-emitting element layer EML from particles such as dust.

For example, a second substrate may be disposed on the light-emitting element layer EML instead of the encapsulation layer TFE, such that the space between the light-emitting element layer EML and the second substrate may be empty or filled with a filling film. The filler film may be an epoxy filler film or a silicon filler film.

Figure 11:
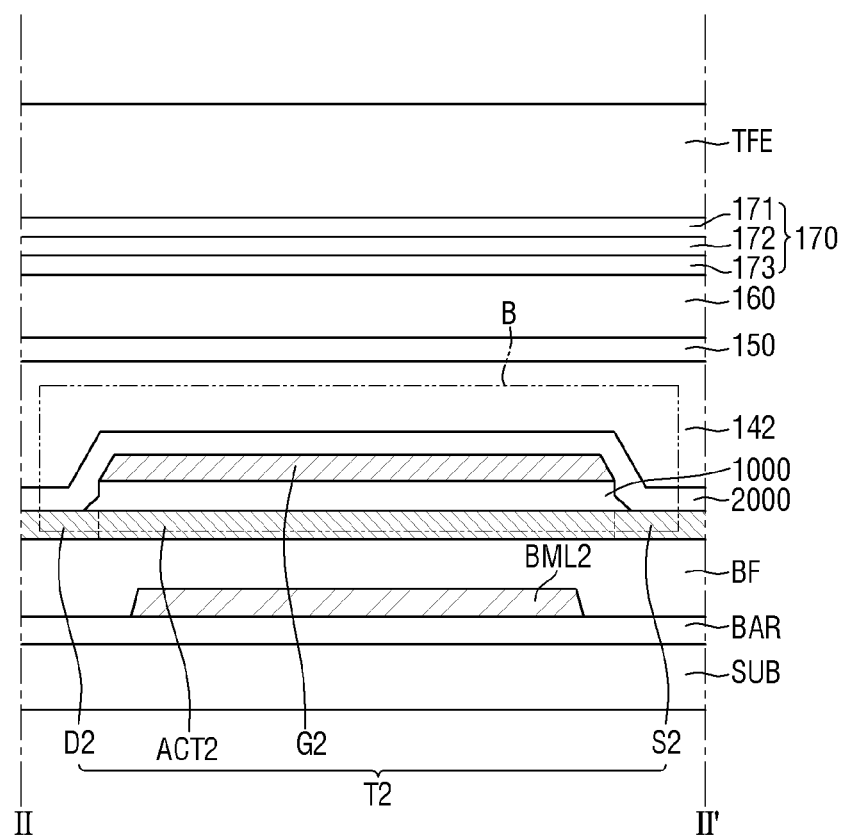
FIG. 11 is a schematic cross-sectional view taken along line II-II' of FIG. 5.
Figure 12:
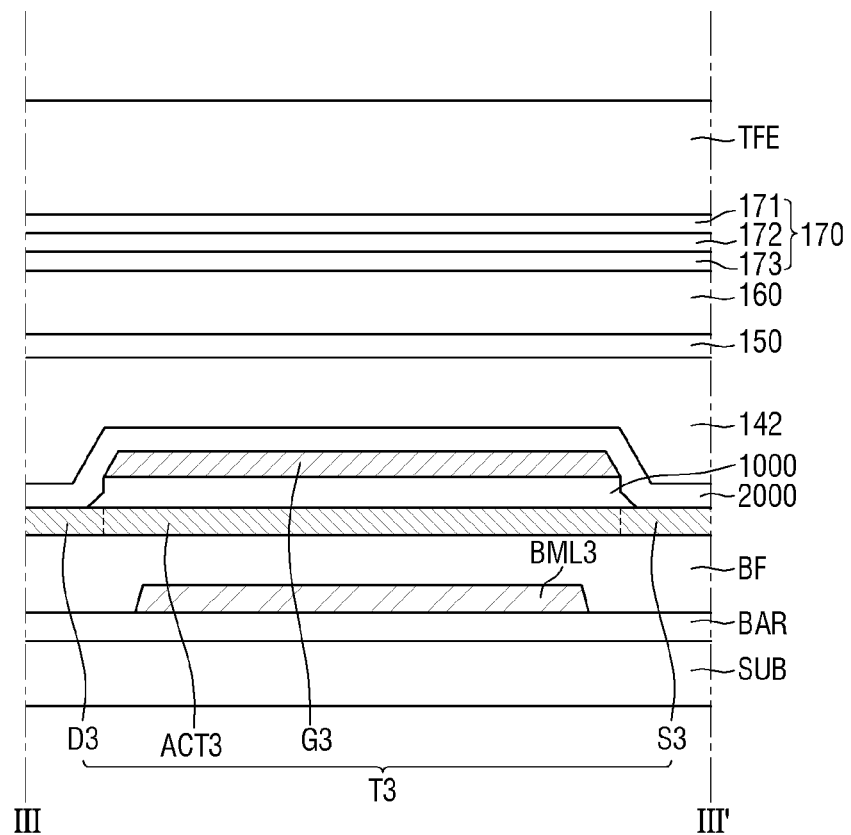
FIG. 12 is a schematic cross-sectional view taken along line III-III' of FIG. 5.
Figure 13:
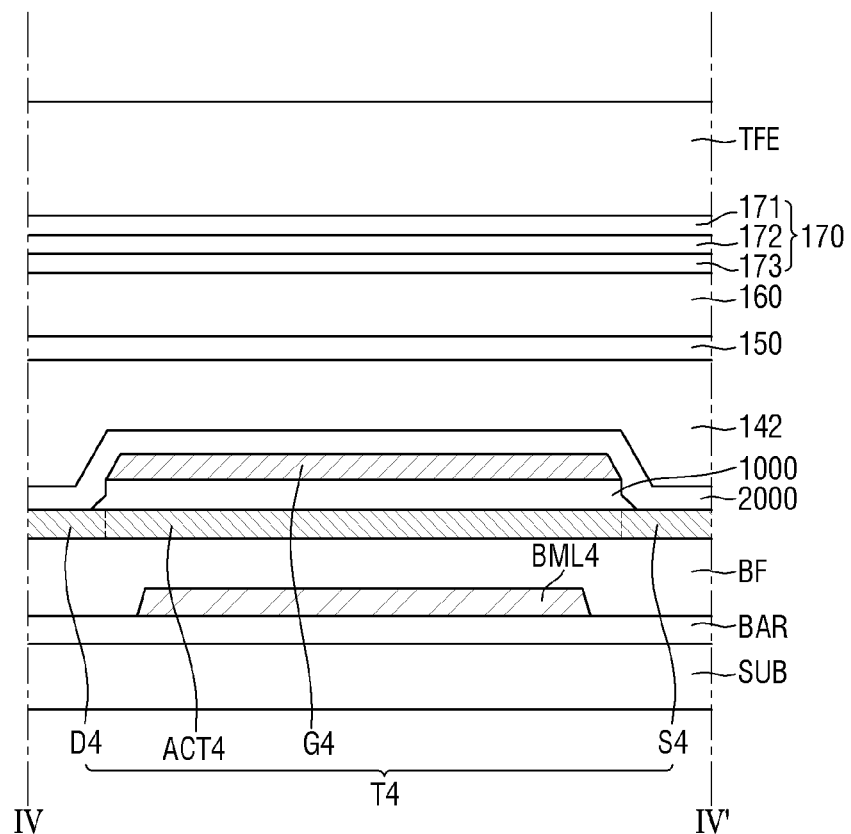
FIG. 13 is a schematic cross-sectional view taken along line IV-IV' of FIG. 5.
Figure 14:
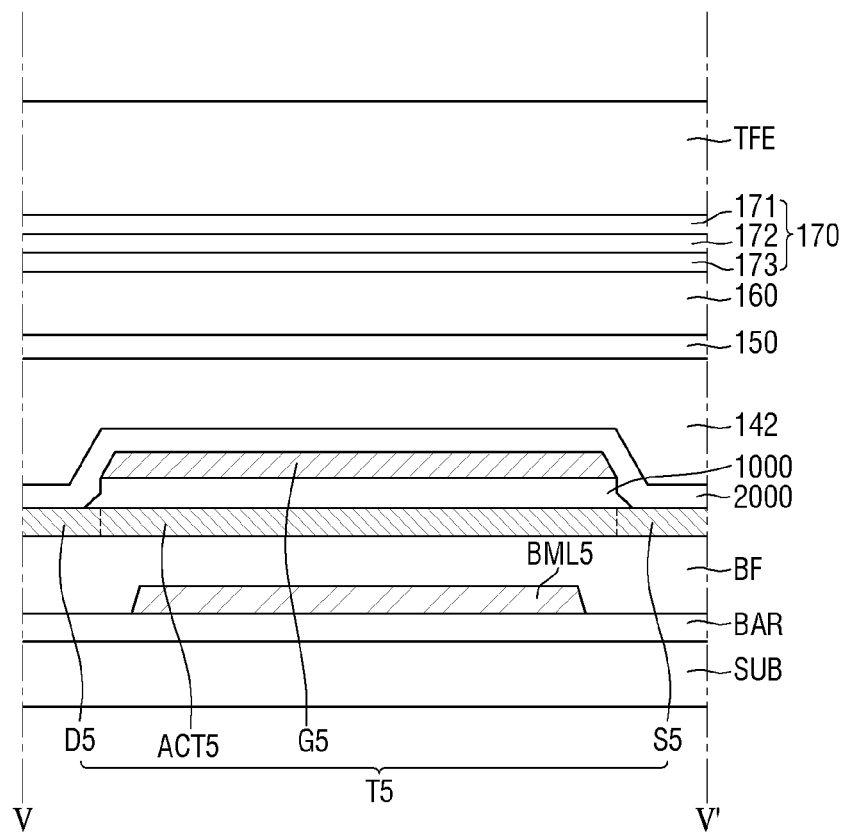
FIG. 14 is a schematic cross-sectional view taken along line V-V' of FIG. 5.

FIG. 11 is a schematic cross-sectional view taken along line II-II' of FIG. 5. FIG. 12 is a schematic cross-sectional view taken along line III-III' of FIG. 5. FIG. 13 is a schematic cross-sectional view taken along line IV-IV' of FIG. 5. FIG. 14 is a schematic cross-sectional view taken along line V-V' of FIG. 5.

Referring to FIG. 11, a thin-film transistor layer TFTL, the light-emitting element layer EML, and an encapsulation layer TFE may be sequentially formed on a first sub strate-SUB.

The thin-film transistor layer TFTL may include a buffer film BF, a semiconductor layer SEM, a first gate insulator, a second gate electrode G2, a second gate insulator 2000, a protective film 150, and a planarization film 160. The semiconductor layer SEM may include a first electrode, a second active layer ACT2 and a second electrode.

A protection member BAR may be formed on one surface or a surface of the substrate, and the second light-blocking layer BML2 may be formed on one surface or a surface of the protection member BAR. The second light-blocking layer BML2 may overlap a channel region of the second active layer ACT2. It is possible to prevent the light incident from the substrate SUB from being incident on the channel region of the second active layer ACT2 by virtue of the second light-blocking layer BML2. In this manner, it is possible to prevent leakage current which otherwise may flow to the channel region of the second active layer ACT2 due to the light.

According to an embodiment, the second light-blocking layer BML2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The protection member BAR may be eliminated.

A buffer film BF may be formed on one surface or a surface of the light-blocking layer and the protection member BAR. The buffer film BF can protect the second thin-film transistor and the organic emitting layer 172 of the light-emitting element layer EML from moisture that is likely to permeate through the substrate SUB. The buffer layer BF may be formed of inorganic layers alternately stacked each other. For example, the buffer layer BF may be made up of multiple layers in which one or more inorganic layers of a silicon nitride layer, a silicon oxynitride layer, a silicon oxide layer, a titanium oxide layer and an aluminum oxide layer may be alternately stacked each other. The buffer film BF may be eliminated.

The semiconductor layer SEM may be formed on the buffer film BF. The semiconductor layer SEM may include polycrystalline silicon, single crystal silicon, low-temperature polycrystalline silicon, amorphous silicon, or an oxide semiconductor.

The first gate insulator may be formed on the semiconductor layer SEM. The gate insulating film 130 may include one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$) A side surface of the first gate insulator may include a first inclined portion 1001 and a second inclined portion 1002 having different inclinations. The shape of the first gate insulator will be described later in detail with reference to FIGS. 15 and 16.

A (1-1) gate electrode G1-1 may be formed on the first gate insulator. The (1-1) gate electrode G1-1 may include one of molybdenum (Mo), aluminum (Al), chromium (Cr), gold (Au), titanium (Ti), nickel (Ni), neodymium (Nd) and copper (Cu). For example, the second gate electrode G2 may be made up of a single layer or multiple layers made of an alloy thereof.

A second gate insulator 2000 may be formed on the (1-1) gate electrode G1-1. The second gate insulator 2000 may include a high-k material. For example, the second gate insulator 2000 may include one of silicon nitride ($SiN_x$), silicon oxynitride (SiON), aluminum oxide ($AlO_x$), hafnium oxide ($HfO_x$), and zirconium oxide ($ZrO_x$) The second gate insulator 2000 may include inorganic films.

An interlayer dielectric film 142 may be formed on the second gate insulator 2000. The interlayer dielectric film 142 may include one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$) The interlayer dielectric film 142 may include a number of inorganic films.

A planarization film 160 may be formed on the interlayer dielectric film 142 to provide a flat surface over the elements having different heights. The planarization film 160 may be formed of an organic layer such as an acryl resin, an epoxy resin, a phenolic resin, a polyamide resin and a polyimide resin.

The protective film 150 may be further formed between the data metal layer DTL and the planarization film 160. The protective film 150 may be formed of, for example, one of silicon oxide ($SiO_x$), silicon nitride ($SiN_x$), silicon oxynitride ($SiO_xN_y$), aluminum nitride (AlN), aluminum oxide ($Al_xO_y$), hafnium oxide ($HfO_x$), and zirconium oxide ($ZrO_x$).

In the top-emission organic light-emitting diode that light exits from the organic emitting layer 172 toward the second light-emitting electrode 173, the first light-emitting electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The pixel-defining film 180 may be formed on the planarization film 160 to partition the first light-emitting electrode 171 in order to define an emission area of each of the sub-pixels SP. The pixel-defining film 180 may be formed to cover the edge of the first light-emitting electrode 171. The pixel-defining film 180 may be formed of an organic layer such as an acryl resin, an epoxy resin, a phenolic resin, a polyamide resin and a polyimide resin.

In the emission area of each of the sub-pixels SP, the first light-emitting electrode 171, the organic emitting layer 172 and the second light-emitting electrode 173 may be stacked each other sequentially, so that holes from the first light-emitting electrode 171 and electrons from the second light-emitting electrode 173 are combined with each other in the organic emitting layer 172 to emit light.

The organic emitting layer 172 is formed on the first light-emitting electrode 171 and the pixel-defining layer 180. The organic emitting layer 172 may include an organic material and emit light of a particular color. For example, the organic emitting layer 172 may include a hole transporting layer, an organic material layer, and an electron transporting layer.

The second light-emitting electrode 173 is formed on the organic emitting layer 172. The second light-emitting electrode 173 may be formed to cover the organic emitting layer 172. The second light-emitting electrode 173 may be a common layer formed across the sub-pixels SP. A capping layer may be formed on the second light-emitting electrode 173.

In the top-emission organic light-emitting diode, the second light-emitting electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In case that the second light-emitting electrode 173 is formed of a semi-transmissive conductive material, the light extraction efficiency can be increased by using microcavities.

The encapsulation layer TFE may be formed on the light-emitting element layer EML. The encapsulation layer TFE may include at least one inorganic film to prevent permeation of oxygen or moisture into the light-emitting element layer EML. The encapsulation layer TFE may include at least one organic film to protect the light-emitting element layer EML from particles such as dust.

For example, a second substrate may be disposed on the light-emitting element layer EML instead of the encapsulation layer TFE, such that the space between the light-emitting element layer EML and the second substrate may be empty or filled with a filling film. The filler film may be an epoxy filler film or a silicon filler film.

It should be noted that the above-described second transistor T2 and the insulating layers overlapping therewith may be substantially identical to the third to fifth transistors T5 and the insulating layers overlapping therewith shown in FIGS. 12 to 14.

Figure 15:
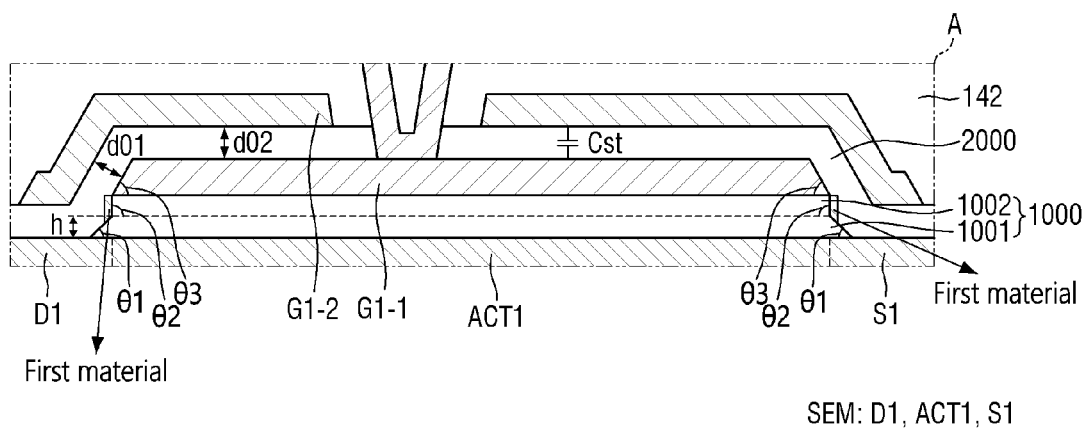
FIG. 15 is an enlarged view of area A of FIG. 10.

FIG. 15 is an enlarged view of area A of FIG. 10.

Referring to FIG. 15, the first gate insulator may have a two-step tapered shape. By way of example, the side surface of the first gate insulator may include a first inclined portion 1001 having a first inclination and a second inclined portion 1002 having a second inclination. The angle formed by the first inclined portion 1001 and the semiconductor layer SEM is defined as $\theta 1$, and the angle formed by the second inclined portion 1002 and a plane parallel to the semiconductor layer SEM is defined as $\theta 2$.

The angle $\theta 1$ may have a smaller value than the angle $\theta 2$. More by way of example, the angle $\theta 1$ may have a value greater than about 0° and less than about 45°. As such, the angle of the first inclined portion 1001 is equal to or less than about 45°, so that it is possible to prevent a problem that ion particles of the semiconductor layer SEM are sputtered on the side surface of the first gate insulator in the process of etching the first gate insulator and thus a short-circuit is formed between the semiconductor layer SEM and the (1-1) gate electrode G1-1. In other words, as the angle of the first inclined portion 1001 is sufficiently low, even if ion particles of the semiconductor element are sputtered during the process of etching the first gate insulator, they are not in contact with the first inclined portion 1001 but in contact only with the second inclined portion 1002, and thus the region of the first inclined portion 1001 can remain insulated. By way of example, the first material may be disposed between the side surface of the second inclined portion 1002 and the second gate insulator 2000, and the first material may at least partially cover the side surface of the second inclined portion 1002. On the other hand, the first material is not disposed on the side surface of the first inclined portion 1001, and the side surface of the first inclined portion 1001 may be in direct contact with the second gate insulator 2000. The first material may be ion particles of the semiconductor layer SEM. For example, in case that the semiconductor layer SEM is formed of indium-gallium-zinc oxide (IGZO), the first material may be indium (In).

The shortest distance from the contact surface between the first inclined portion 1001 and the second inclined portion 1002 to the semiconductor layer SEM is defined as h. The distance h has a value equal to or greater than about 600 Å. As the distance h has a sufficiently large value, there can be a sufficient distance between the ions of the semiconductor layer SEM sputtered on the second inclined portion 1002 and the semiconductor layer SEM, so that it is possible to prevent an electrical breakdown from occurring between the (1-1) gate electrode G1-1 and the semiconductor layer SEM despite the presence of the first inclined portion 1001 in an insulating state. In other words, a sufficient distance between the semiconductor layer SEM and the second inclined portion 1002 can be achieved, so that leakage of current can be prevented.

The angle between the upper surface of the first gate insulator and the side surface of the (1-1) gate electrode G1-1 is defined as $\theta 3$. The angle $\theta 3$ may have a value in a range of about 0° to about 55°. For example, the angle $\theta 3$ may be about 40° and may have, but is not limited to, a value greater than the value of the angle $\theta 1$.

As described above, by setting the angle of the first inclined portion 1001 of the first gate insulator and the angle of the side surface of the first gate electrode to given values or less, it is possible to mitigate a sharp step height by the first gate insulator and the (1-1) gate electrode G1-1. Accordingly, the step height of the second gate insulator 2000 stacked on the first gate insulator and the (1-1) gate electrode G1-1 can be reduced. In other words, by setting the angles $\theta 1$ and $\theta 3$ to be given values or less, it is possible to prevent a seam which may be caused by the second gate insulator 2000 due to the step height.

According to an embodiment, it is possible to ensure a sufficient thickness of the side surface of the second gate insulator 2000, for example, a sufficient shortest distance from the side surface of the (1-1) gate electrode G1-1 to the (1-2) gate electrode G1-2. More by way of example, the thickness of the side surface of the second gate insulator 2000, for example, the shortest distance from the side surface of the (1-1) gate electrode G1-1 to the (1-2) gate electrode G1-2 is defined as d01. The thickness of the upper surface of the second gate insulator 2000, for example, the shortest distance from the upper surface of the (1-1) gate electrode G1-1 to the (1-2) gate electrode G1-2 is defined as d02. In this instance, the value obtained by dividing d01 by d02 may be about 0.8 or more. In other words, the thickness d01 may be 80% or more of the thickness d02. For example, the second gate insulator 2000 can have excellent step coverage characteristics.

Figure 16:
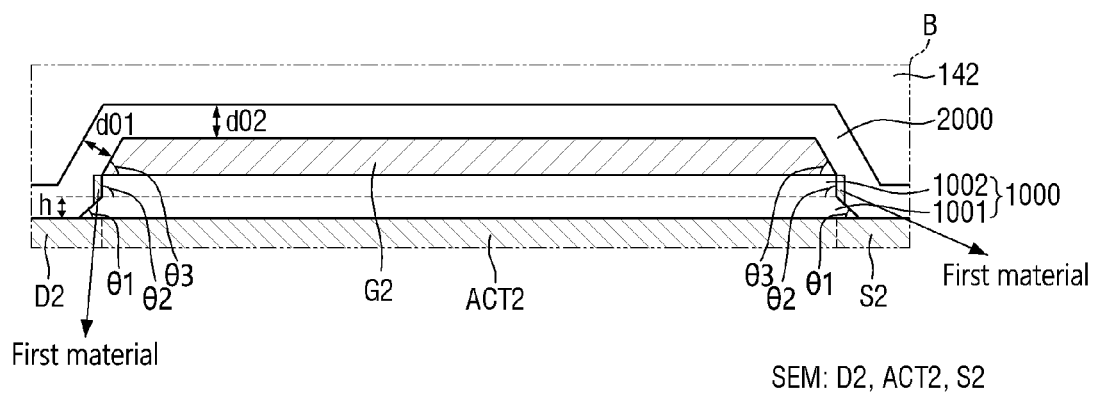
FIG. 16 is an enlarged view of area B of FIG. 11.

FIG. 16 is an enlarged view of area B of FIG. 11.

Referring to FIG. 16, a first gate insulator, a second gate electrode G2 and a second gate insulator 2000 forming a second transistor T2 may also have substantially the same shape as those of the first transistor T1 described above with reference to FIG. 15.

The first gate insulator may have a two-step tapered shape. By way of example, the side surface of the first gate insulator may include a first inclined portion 1001 having a first inclination and a second inclined portion 1002 having a second inclination. The angle formed by the first inclined portion 1001 and the semiconductor layer SEM is defined as θ1, and the angle formed by the second inclined portion 1002 and a plane parallel to the semiconductor layer SEM is defined as θ2.

The angle θ1 may have a smaller value than the angle θ2. More by way of example, the angle θ1 may have a value greater than about 0° and less than about 45°. As such, the angle of the first inclined portion 1001 is equal to or less than about 45°, so that it is possible to prevent a problem that ion particles of the semiconductor layer SEM are sputtered on the side surface of the first gate insulator in the process of etching the first gate insulator and thus a short-circuit is formed between the semiconductor layer SEM and the second gate electrode G2. In other words, as the angle of the first inclined portion 1001 is sufficiently low, even if ion particles of the semiconductor element are sputtered during the process of etching the first gate insulator, they are not in contact with the first inclined portion 1001 but in contact only with the second inclined portion 1002, and thus the region of the first inclined portion 1001 can remain insulated. By way of example, the first material may be disposed between the side surface of the second inclined portion 1002 and the second gate insulator 2000, and the first material may at least partially cover the side surface of the second inclined portion 1002. On the other hand, the first material is not disposed on the side surface of the first inclined portion 1001, and the side surface of the first inclined portion 1001 may be in direct contact with the second gate insulator 2000. The first material may be ion particles of the semiconductor layer SEM. For example, in case that the semiconductor layer SEM is formed of indium-gallium-zinc oxide (IGZO), the first material may be indium (In).

The shortest distance from the contact surface between the first inclined portion 1001 and the second inclined portion 1002 to the semiconductor layer SEM is defined as h. The distance h has a value equal to or greater than about 600 Å. As the distance h has a sufficiently large value, there can be a sufficient distance between the ions of the semiconductor layer SEM sputtered on the second inclined portion 1002 and the semiconductor layer SEM, so that it is possible to prevent an electrical breakdown from occurring between the second gate electrode G2 and the semiconductor layer SEM despite the presence of the first inclined portion 1001 in an insulating state. In other words, a sufficient distance between the semiconductor layer SEM and the second inclined portion 1002 can be achieved, so that leakage of current can be prevented.

The angle between the upper surface of the first gate insulator and the side surface of the second gate electrode G2 is defined as θ3. The angle θ3 may have a value in a range of about 0° to about 55°. For example, the angle θ3 may be about 40° and may have, but is not limited to, a value greater than the value of the angle θ1.

As described above, by setting the angle of the first inclined portion 1001 of the first gate insulator and the angle of the side surface of the first gate electrode to given values or less, it is possible to mitigate a sharp step height by the first gate insulator and the first gate electrode. Accordingly, the step height of the second gate insulator 2000 stacked on the first gate insulator and the second gate electrode G2 can be reduced. In other words, by setting the angles θ1 and θ3 to be given values or less, it is possible to prevent a seam which may be caused by the second gate insulator 2000 due to the step height.

According to an embodiment, it is possible to ensure a sufficient thickness of the side surface of the second gate insulator 2000, for example, a sufficient shortest distance from the side surface of the second gate insulator 2000 to the interlayer dielectric film 142. More by way of example, the thickness of the side surface of the second gate insulator 2000, for example, the shortest distance from the side surface of the second gate electrode G2 to the interlayer dielectric film 142 is defined as d01. The thickness of the upper surface of the second gate insulator 2000, for example, the shortest distance from the upper surface of the second gate electrode G2 to the interlayer dielectric film 142 is defined as d02. In this instance, the value obtained by dividing d01 by d02 may be about 0.8 or more. In other words, the thickness d01 may be 80% or more of the thickness d02. For example, the second gate insulator 2000 can have excellent step coverage characteristics.

Figure 17:
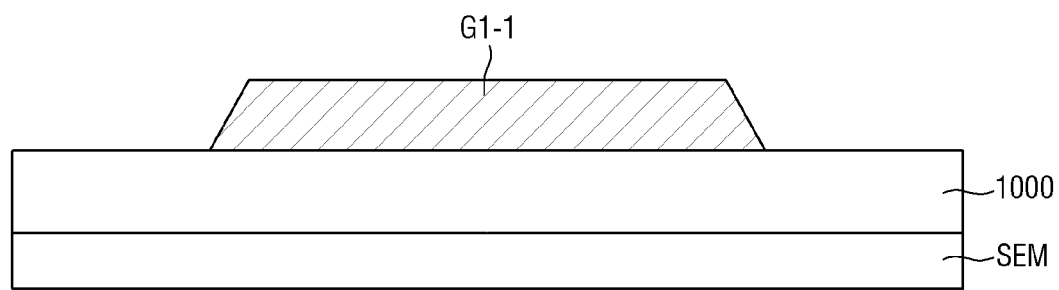
FIGS. 17 to 19 are views schematically showing processing steps of a method of forming a first inclined portion, a second inclined portion, and a side shape of a gate electrode.
Figure 17:
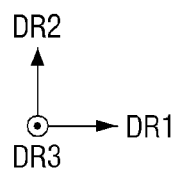
Figure 18:
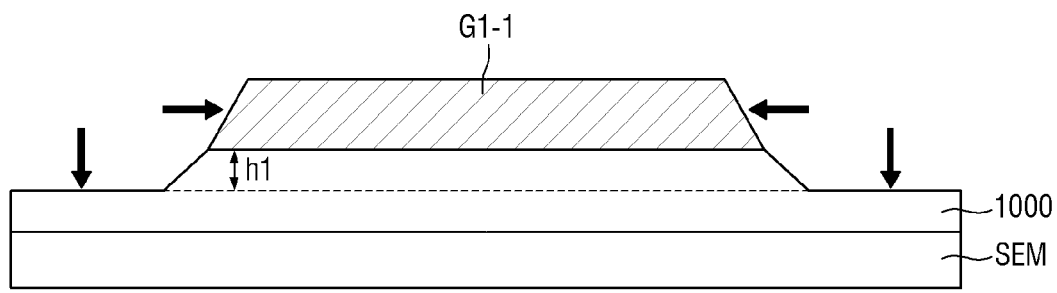
Figure 18:
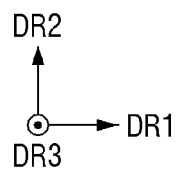
Figure 19:
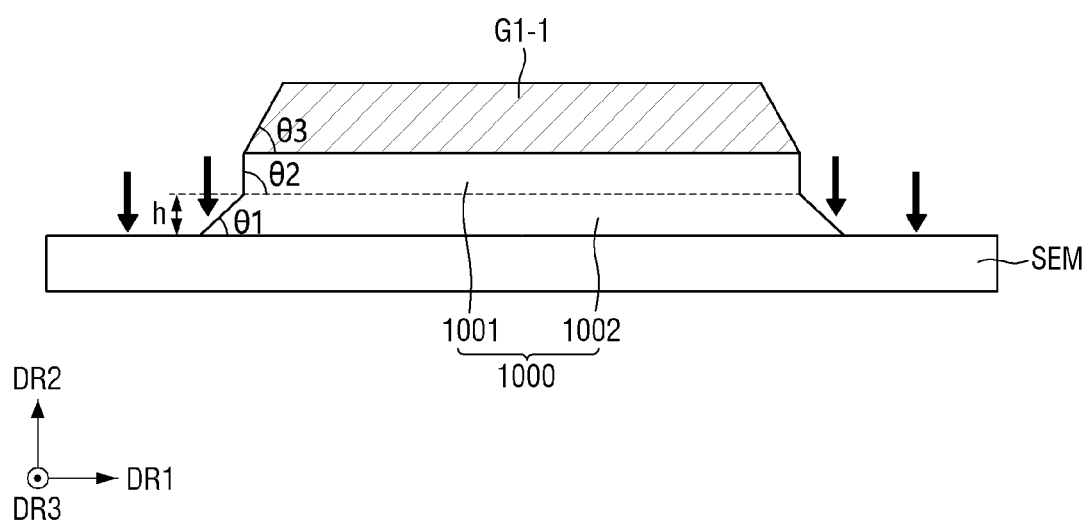

FIGS. 17 to 19 are views schematically showing processing steps of a method of forming a first inclined portion, a second inclined portion, and a side shape of a gate electrode.

Hereinafter, although the first transistor T1 will be described as a reference, the second to fifth transistors T5 and the gate insulator in contact therewith may also be formed in a same manner.

Referring to FIGS. 17 to 19, a first gate insulator is laminated in a flat shape on one surface or a surface of the semiconductor layer SEM, and a (1-1) gate electrode G1-1 is formed on one surface or a surface of the first gate insulator.

Subsequently, as shown in FIG. 18, the first gate insulator and the (1-1) gate electrode may be etched together. More by way of example, the (1-1) gate electrode may be etched in the first direction DR1 and in the direction opposite to the first direction DR1, and the first gate insulator may be etched in the direction opposite to the second direction DR2. The upper surface of the first gate insulator may be etched less in the opposite direction to the second direction DR2 toward the side surface of the first gate electrode. At this step, the shortest distance from the lower surface of the (1-1) gate electrode G1-1 to the plane parallel to the flat upper surface of the first gate insulator is defined as hl. The distance hl may have substantially the same value as the value h described above in FIGS. 15 and 19, but the disclosure is not limited thereto. For example, in case that a part of the upper surface of the first gate insulator 1000 that is not covered by the (1-1) gate electrode G1-1 is etched by a same thickness in the direction opposite to the second direction DR2, the value hl may be substantially equal to the value h. On the other hand, in case that it is etched by different thicknesses due to a difference between the etching direction and the angle of the etched surface of the first gate insulator 1000, there may be a difference in the amount of etching between the part perpendicular to the etching direction and the other part not perpendicular to the etching direction. The value hl may be different from the value h.

By the etching at this step, the side surface of the (1-1) gate electrode G1-1 has a same inclination as described above with reference to FIG. 15, and the first gate insulator has a shape that is the basis of the first inclined portion 1001.

Subsequently, as shown in FIG. 19, only the first gate insulator may be etched in the direction opposite to the second direction DR2 without etching the (1-1) gate electrode G1-1. After this step, the upper surface of the semiconductor layer SEM is exposed to the outside, and the side surface of the first gate insulator may have a two-step tapered shape including the first inclined portion 1001 and the second inclined portion 1002 as described above.

The lower surface of the (1-1) gate electrode G1-1 may be aligned with the upper surface of the first gate insulator 1000 where the (1-1) gate electrode G1-1 covers the first gate insulator 1000. More by way of example, as shown in FIGS. 18 and 19, during the process of etching the first gate insulator 1000, the first gate insulator 1000 is not etched due to the (1-1) gate electrode G1-1 where the (1-1) gate electrode G1-1 covers the first gate insulator 1000, so that the lower surface of the (1-1) gate electrode G1-1 and the upper surface of the first gate insulator 1000 can be aligned with each other.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a light-blocking layer disposed on a substrate;
a semiconductor layer disposed on an opposite side to the light-blocking layer with a buffer film covering the light-blocking layer disposed between the semiconductor layer and the light-blocking layer, the semiconductor layer comprising:
an active layer overlapping the light-blocking layer in plan view; and
first electrodes and second electrodes disposed on both sides of the active layer, respectively;
a first gate insulator disposed on an opposite side to the buffer film with the active layer disposed between the first gate insulator and the buffer film; and
a first gate electrode disposed on an opposite side to the active layer with the first gate insulator disposed between the first gate electrode and the active layer, wherein
a side surface of the first gate insulator comprises:
a first inclined portion contacting a first surface of the semiconductor layer; and
a second inclined portion contacting the first inclined portion and the first gate electrode, and
a first angle between the first surface of the semiconductor layer and the first inclined portion is less than a second angle between the first surface of the semiconductor layer and the second inclined portion.

2. The display device of claim 1, wherein the first angle is greater than about 0° and less than about 45°.

3. The display device of claim 1, wherein a shortest distance from a contact surface between the first inclined portion and the second inclined portion to the semiconductor layer is equal to or greater than about 600 Å.

4. The display device of claim 1, wherein
the first gate electrode comprises:
a first surface facing the first gate insulator;
a second surface opposite to the first surface; and
a side surface connecting the first surface with the second surface, and
a third angle between the first surface and the side surface of the first gate electrode is equal to or less than about 55°.

5. The display device of claim 4, wherein the third angle is greater than the first angle.

6. The display device of claim 4, further comprising:
a second gate insulator covering the first inclined portion, the second inclined portion, the second surface and the side surface of the first gate electrode.

7. The display device of claim 6, further comprising:
a second gate electrode disposed on an opposite side to the first gate electrode with the second gate insulator disposed between the second gate electrode and the first gate electrode.

8. The display device of claim 7, wherein a value obtained by dividing a shortest distance from the side surface of the first gate electrode to the second gate electrode by a shortest distance from the second surface of the first gate electrode to the second gate electrode is equal to or greater than about 0.8.

9. The display device of claim 1, wherein
the semiconductor layer comprises a first material, and
the second inclined portion of the first gate insulator is at least partially covered by the first material.

10. The display device of claim 9, further comprising:
a second gate insulator covering the first gate electrode, the first inclined portion, and the second inclined portion,
wherein the first material is disposed between the second inclined portion of the first gate insulator and the second gate insulator.

11. The display device of claim 10, wherein the first inclined portion of the first gate insulator directly contacts the second gate insulator.

12. The display device of claim 11, wherein the semiconductor layer comprises an oxide semiconductor.

13. The display device of claim 12, wherein the first material is indium (In).

14. The display device of claim 1, wherein a voltage is applied to each of the first gate electrode and the light-blocking layer.

15. The display device of claim 14, wherein the voltage applied to the light-blocking layer is substantially identical to the voltage applied to the first gate electrode.

16. A display device comprising:
a semiconductor layer comprising an active layer;
a first gate insulator covering the active layer and disposed on the semiconductor layer;
a first gate electrode disposed on the first gate insulator;

a second gate insulator covering the first gate insulator and the first gate electrode; and a second gate electrode disposed on the second gate insulator, wherein a side surface of the first gate insulator comprises:
- a first inclined portion contacting a first surface of the semiconductor layer; and
- a second inclined portion contacting the first inclined portion and the first gate electrode, wherein the semiconductor layer comprises a first material, and the second inclined portion is at least partially covered by the first material, and a value obtained by dividing a shortest distance from a side surface of the first gate electrode to the second gate electrode by a shortest distance from an upper surface of the first gate electrode to the second gate electrode is equal to or greater than about 0.8.

17. The display device of claim 16, wherein
the first gate insulator comprises a second material, and
the second gate insulator comprises a third material different from the second material.

18. The display device of claim 17, wherein a permittivity of the third material is greater than a permittivity of the second material.

19. The display device of claim 18, wherein
the second material is silicon oxide ($SiO_x$), and
the third material is one selected from a group consisting of: silicon nitride ($SiN_x$), silicon oxynitride (SiON), aluminum oxide ($AlO_x$), hafnium oxide ($HfO_x$), and zirconium oxide ($ZrO_x$).

20. The display device of claim 16, further comprising:
a storage capacitor disposed between the first gate electrode and the second gate electrode.

* * * * *